(12) United States Patent
Seo et al.

(10) Patent No.: US 9,831,202 B2
(45) Date of Patent: Nov. 28, 2017

(54) SEMICONDUCTOR DEVICES WITH SOLDER-BASED CONNECTION TERMINALS AND METHOD OF FORMING THE SAME

(71) Applicant: Samsung Electronics Co., Ltd., Suwon-si, Gyeonggi-do (KR)

(72) Inventors: Sun-kyoung Seo, Suwon-si (KR); Seung-kwan Ryu, Seongnam-si (KR); Ju-il Choi, Seongnam-si (KR); Tae-je Cho, Yongin-si (KR); Yong-hwan Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/262,040

(22) Filed: Sep. 12, 2016

(65) Prior Publication Data

US 2017/0084561 A1    Mar. 23, 2017

(30) Foreign Application Priority Data

Sep. 22, 2015    (KR) .......................... 10-2015-0133876

(51) Int. Cl.
*H01L 23/48* (2006.01)
*H01L 23/52* (2006.01)
(Continued)

(52) U.S. Cl.
CPC .............. *H01L 24/13* (2013.01); *H01L 24/05* (2013.01); *H01L 24/11* (2013.01); *H01L 24/16* (2013.01); *H01L 2224/02205* (2013.01); *H01L 2224/02215* (2013.01); *H01L 2224/0401* (2013.01); *H01L 2224/05124* (2013.01); *H01L 2224/05147* (2013.01); *H01L 2224/05155* (2013.01); *H01L 2224/05184* (2013.01); *H01L 2224/1162* (2013.01); *H01L 2224/11614* (2013.01);
(Continued)

(58) Field of Classification Search
CPC ... H01L 2224/16227; H01L 2225/1058; H01L 2224/04941; H01L 24/16; H01L 2224/81; H01L 24/13
USPC .................................................. 257/780, 781
See application file for complete search history.

(56) References Cited

U.S. PATENT DOCUMENTS 3,821,785 A * 6/1974 Rose ....................... H01L 21/00
257/751
5,059,553 A * 10/1991 Berndlmaier .......... H01L 24/11
228/180.22

(Continued)

*Primary Examiner* — S. V. Clark
(74) *Attorney, Agent, or Firm* — Myers Bigel, P.A.

(57) ABSTRACT

An electronic device is provided, which includes a substrate having an electrically conductive contact pad thereon and an electrically conductive connection terminal on the contact pad. The connection terminal includes an electrically conductive pillar structure and a solder layer that extends on the pillar structure and contacts a protruding portion of a sidewall of the pillar structure. The pillar structure can include a lower pillar layer, a diffusion barrier layer on the lower pillar layer and an upper pillar layer on the diffusion barrier layer. In some additional embodiments of the invention, the protruding portion of the sidewall of the pillar structure includes an outermost portion of an upper surface of the diffusion barrier layer. This can be achieved by making a width of the diffusion barrier layer greater than a width of the upper pillar layer when viewed in transverse cross-section.

14 Claims, 24 Drawing Sheets

(51) Int. Cl.
*H01L 29/40* (2006.01)
*H01L 23/00* (2006.01)

(52) U.S. Cl.
CPC ............... *H01L 2224/11849* (2013.01); *H01L 2224/13014* (2013.01); *H01L 2224/13018* (2013.01); *H01L 2224/13026* (2013.01); *H01L 2224/13083* (2013.01); *H01L 2224/13564* (2013.01); *H01L 2224/16227* (2013.01); *H01L 2924/05042* (2013.01); *H01L 2924/05442* (2013.01); *H01L 2924/07025* (2013.01)

(56) References Cited

U.S. PATENT DOCUMENTS

| | | | |
|---|---|---|---|
| 6,828,677 B2 * | 12/2004 | Yap | H01L 24/11 257/737 |
| 7,361,993 B2 * | 4/2008 | Coolbaugh | H01L 24/11 257/737 |
| 8,253,248 B2 | 8/2012 | Ke et al. | |
| 8,643,150 B1 * | 2/2014 | Xu | H01L 24/11 257/632 |
| 8,698,308 B2 | 4/2014 | Lin et al. | |
| 8,884,339 B2 | 11/2014 | Jang et al. | |
| 8,952,537 B2 | 2/2015 | Chan et al. | |
| 9,013,042 B2 | 4/2015 | Lin et al. | |
| 9,041,225 B2 | 5/2015 | Lin et al. | |
| 2012/0007231 A1 | 1/2012 | Chang et al. | |
| 2012/0091577 A1 | 4/2012 | Hwang et al. | |
| 2012/0295434 A1 | 11/2012 | Cho et al. | |
| 2014/0070409 A1 | 3/2014 | Lai et al. | |
| 2014/0077359 A1 | 3/2014 | Tsai et al. | |

* cited by examiner

SEMICONDUCTOR DEVICES WITH SOLDER-BASED CONNECTION TERMINALS AND METHOD OF FORMING THE SAME

REFERENCE TO PRIORITY APPLICATION

This application claims the benefit of Korean Patent Application No. 10-2015-0133876, filed Sep. 22, 2015, in the Korean Intellectual Property Office, the disclosure of which is hereby incorporated herein in its entirety by reference.

BACKGROUND

The inventive concept relates to semiconductor devices and methods of manufacturing the same, and more particularly, to semiconductor devices including a bump structure and methods of manufacturing the semiconductor device.

As the electronics industry has grown dramatically and users' demands have increased, electronic devices have smaller designs and increased functions. Semiconductor devices that are used in electronic devices have also been increasingly demanded to have smaller designs and more multiple functions. Accordingly, semiconductor devices including connection terminals having micro pitches are demanded. However, since amounts of solder layers included in the connection terminals having the micro pitches are small, it is difficult to provide reliable electrical connection between the semiconductor devices and external devices.

SUMMARY

The inventive concept provides a semiconductor device including a connection terminal having a micro pitch, which may provide reliable electrical connection, and a method of manufacturing the semiconductor device.

According to some embodiments of the invention, an electronic device is provided, which includes a substrate having an electrically conductive contact pad thereon and an electrically conductive connection terminal on the contact pad. The connection terminal includes an electrically conductive pillar structure and a solder layer that extends on the pillar structure and contacts a protruding portion of a sidewall of the pillar structure. In some of these embodiments of the invention, the pillar structure includes a lower pillar layer, a diffusion barrier layer on the lower pillar layer and an upper pillar layer on the diffusion barrier layer. In some additional embodiments of the invention, the protruding portion of the sidewall of the pillar structure includes an outermost portion of an upper surface of the diffusion barrier layer. This can be achieved by making a width of the diffusion barrier layer greater than a width of the upper pillar layer when viewed in transverse cross-section, so that the solder layer directly contacts the outermost portion of the upper surface of the diffusion barrier layer (post reflow).

According to still further embodiments of the invention, an upper surface of the diffusion barrier layer is configured to directly contact a bottom surface of the upper pillar layer. A width of the diffusion barrier layer may also be greater than a width of the lower pillar layer when viewed in transverse cross-section. Based on this configuration, the outermost portion of the upper surface of the diffusion barrier layer will be ring/annular-shaped (e.g., circular-ring, rectangular-ring, etc.) when viewed in a direction normal to the upper surface of the diffusion barrier layer. Furthermore, the solder layer may directly contact an upper surface of the upper pillar layer and an entirety of a ring-shaped portion of an upper surface of the diffusion barrier layer. The upper pillar layer and the diffusion barrier layer may be configured as different materials having different reflow characteristics with respect to solder.

According to still further embodiments of the invention, a height of the solder layer as measured from an upper surface of the upper pillar layer is within a range from about 50% to about 90% the width of the diffusion barrier layer. A width of the upper pillar layer may also be within a range from about 80% to about 98% the width of the diffusion barrier layer. Similarly, a width of the diffusion barrier layer may be greater than a width of the lower pillar layer when viewed in transverse cross-section and the width of the lower pillar layer may be within a range from about 80% to about 98% the width of the diffusion barrier layer. In still further embodiments of invention, the width of the upper pillar layer may be within a range from about 30% to about 80% the width of the diffusion barrier layer and a width of the lower pillar layer may be less than a width of the upper pillar layer when viewed in transverse cross-section.

According to additional embodiments of the invention, a passivation layer is provided on the substrate. The passivation layer may have an opening therein, which exposes an upper surface of the contact pad. In some of these embodiments, the opening is at least partially lined with a lower metal layer and a sidewall of the lower pillar layer may be aligned (or recessed) relative to a sidewall of the lower metal layer.

According to additional embodiments of the inventive concept, there is provided a semiconductor device including a conductive pad disposed on a substrate and a connection terminal electrically connected to the conductive pad. The connection terminal includes a conductive pillar structure including a lower pillar layer, a diffusion barrier layer, and an upper pillar layer that are sequentially stacked. The conductive pillar structure further includes a protrusion on a side wall of the conductive pillar structure and a solder layer disposed on the upper pillar layer and contacting at least a part of the protrusion.

According to another aspect of the inventive concept, there is provided a semiconductor device including a conductive pad disposed on a substrate and a connection terminal electrically connected to the conductive pad. The connection terminal includes a conductive pillar structure including a lower pillar layer, a diffusion barrier layer, and an upper pillar layer that are sequentially stacked on the conductive pad and a solder layer disposed on the upper pillar layer and a portion of the diffusion barrier layer. A first width of the upper pillar layer in a first direction parallel to a top surface of the substrate may be less than a second width of the diffusion barrier layer in the first direction.

According to still further embodiments of the invention, a method of forming an electronic device is provided, which includes forming a composite of a lower pillar layer, a diffusion barrier layer on the lower pillar layer and an upper pillar layer on the diffusion barrier layer. A solder layer is also formed on the upper pillar layer prior to recessing a sidewall of the upper pillar layer relative to sidewalls of the solder layer and diffusion barrier layer. This recessing step is followed by reflowing the solder layer onto the recessed sidewall of the upper pillar layer and onto an upper surface of the diffusion barrier layer. In particular, the recessing step may include recessing a sidewall of the upper pillar layer to expose a ring-shaped upper surface of the diffusion barrier layer and a ring-shaped lower surface of the solder layer.

Thereafter, the recessing is followed by reflowing the solder layer onto the recessed sidewall of the upper pillar layer and onto the ring-shaped upper surface of the diffusion barrier layer.

According to another aspect of the inventive concept, there is provided a method of manufacturing a semiconductor device. This method can include forming a mask layer including an opening on a substrate, sequentially forming a lower pillar layer, a diffusion barrier layer, an upper pillar layer, and a solder layer in the opening, removing the mask layer, and reducing a width of the upper pillar layer so that the side wall of the upper pillar layer is further inward than a side wall of the diffusion barrier layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
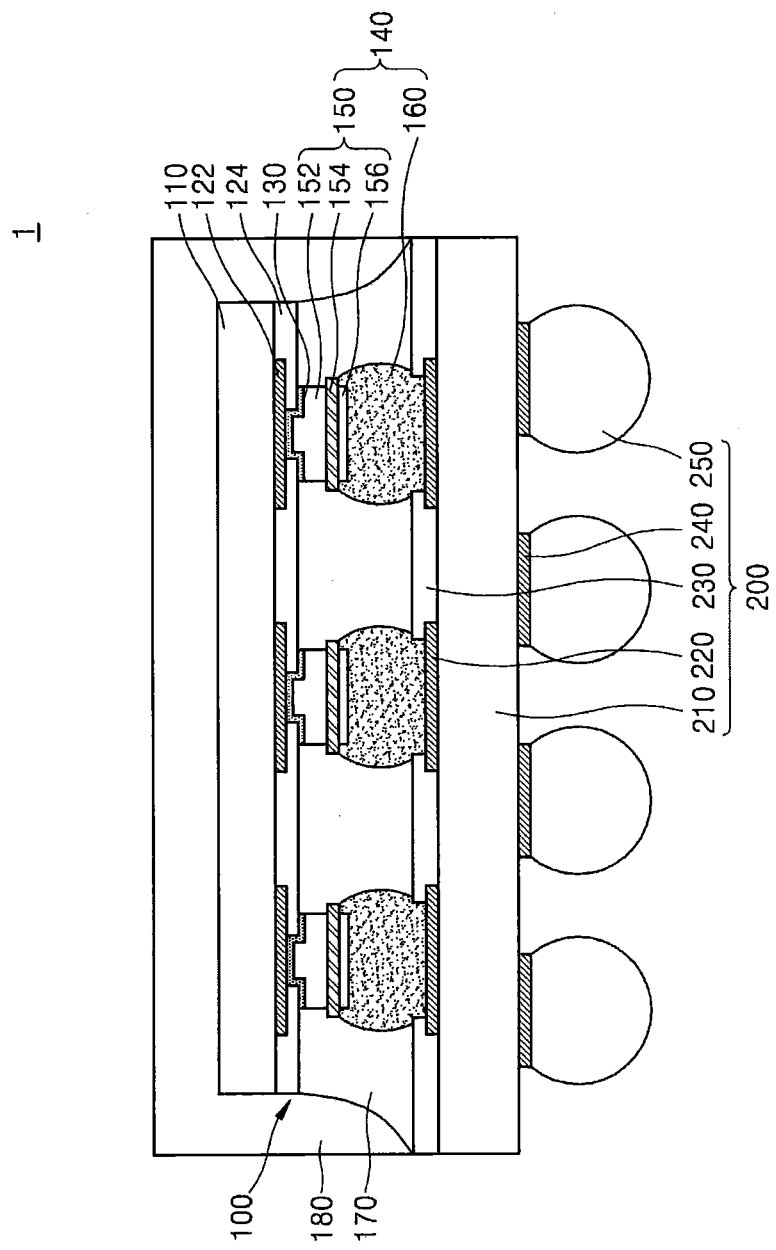
FIG. 1 is a cross-sectional view of a semiconductor device according to example embodiments.

The inventive concept now will be described more fully hereinafter with reference to the accompanying drawings, in which elements of the inventive concept are shown. The inventive concept may, however, be embodied in many different forms and should not be construed as limited to the example embodiments set forth herein. Rather, these embodiments are provided so that this disclosure will be thorough and complete, and will fully convey the scope of the inventive concept to one of ordinary skill in the art. In the drawings, sizes and relative sizes of elements may be exaggerated for convenience of explanation.

It will be understood that when an element or layer is referred to as being "formed on", another element, it can be directly or indirectly formed on the other element. That is, for example, intervening elements may be present. In contrast, when an element is referred to as being "directly formed on", to another element, there are no intervening present. Other words used to describe the relationship between elements should be interpreted in a like fashion (e.g., "between" versus "directly between", etc.).

It will be understood that, although the terms first, second, third etc. may be used herein to describe various elements, these elements should not be limited by these terms. These terms are only used to distinguish one element from another element. Thus, a first element could be termed a second element and, similarly, a second element could be termed a first element without departing from the teachings of example embodiments.

The terminology used herein is for the purpose of describing example embodiments only and is not intended to be limiting of example embodiments of the inventive concept. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms used herein have the same meaning as commonly understood by one of ordinary skill in the art to which example embodiments belong. As used herein, the term "and/or" includes any and all combinations of one or more of the associated listed items. Expressions such as "at least one of" when preceding a list of elements, modify the entire list of elements and do not modify the individual elements of the list.

FIG. 1 is a cross-sectional view of a semiconductor device 1 according to example embodiments. Referring to FIG. 1, the semiconductor device 1 may include a semiconductor chip 100, a package substrate 200, and a connection terminal 140 configured to connect the semiconductor chip 100 and the package substrate 200. The semiconductor device 1 may be a flip-chip package in which the semiconductor chip 100 is mounted in a face-down manner by using the connection terminal 140 on the package substrate 200.

The semiconductor chip 100 may include a semiconductor substrate 110 and a conductive pad 122 that is formed on the semiconductor substrate 110 and may apply a circuit function of the semiconductor device 1 to the outside. A circuit unit including individual unit elements for the circuit function of the semiconductor device 1 may be formed by using a semiconductor manufacturing process on the semiconductor chip 100. That is, a transistor, a resistor, a capacitor, a conductive wiring line, and an insulting layer disposed therebetween may be formed on the semiconductor chip 100.

The conductive pad 122 may be exposed to a passivation layer 124 that is a final protective layer of the circuit unit of the semiconductor device 1. The conductive pad 122 may be electrically connected to the circuit unit of the semiconductor device 1 and may electrically connect the circuit unit of the semiconductor device 1 to the package substrate 200.

Any of various semiconductor elements such as a memory element (e.g., a dynamic random-access memory (DRAM) or a flash memory), a logic element (e.g., a microcontroller), an analog element, a digital signal processor element, a system-on-chip element, or a combination thereof may be formed on the semiconductor chip 100.

The package substrate 200 may include a base substrate 210, a connection pad 220, an insulating layer 230, an external terminal connection pad 240, and an external terminal 250. The base substrate 210 may include at least one material selected from, for example, phenolic resin, epoxy resin, and polyimide. The connection pad 220 may be formed on one surface of the base substrate 210 and may electrically connect the package substrate 200 and the connection terminal 140. The insulating layer 230 may be formed on a top surface of the base substrate 210 and may expose a part of a top surface of the connection pad 220. The external terminal connection pad 240 may be formed on the other surface of the base substrate 210, and the external terminal 250 may be attached to the external terminal connection pad 240. For example, the external terminal 250 may be a solder ball. The external terminal 250 may electrically connect the semiconductor device 1 to an external electric device.

The connection terminal 140 of the semiconductor chip 100 may be attached to the connection pad 220 of the package substrate 200, and thus the conductive pad 122 of the semiconductor chip 100 may be electrically connected to the connection pad 220. The connection terminal 140 may include a conductive pillar structure 150 and a solder layer 160. The conductive pillar structure 150 and the solder layer 160 will be explained below in detail with reference to FIG. 2. An underfill layer 170 may be formed in a space between the semiconductor chip 100 and the package substrate 200. The underfill layer 170 may surround a side wall of the connection terminal 140 and may fill a space between adjacent connection terminals 140. A molding material 180 may be formed to cover a top surface and a side wall of the semiconductor chip 100. Unlike in FIG. 1, the underfill layer 170 may not be formed, and the molding material 180 may be formed on the top surface and the side wall of the semiconductor chip 100 and on the side wall of the connection terminal 140 to fill a space between the semiconductor chip 100 and the package substrate 200.

Figure 2:
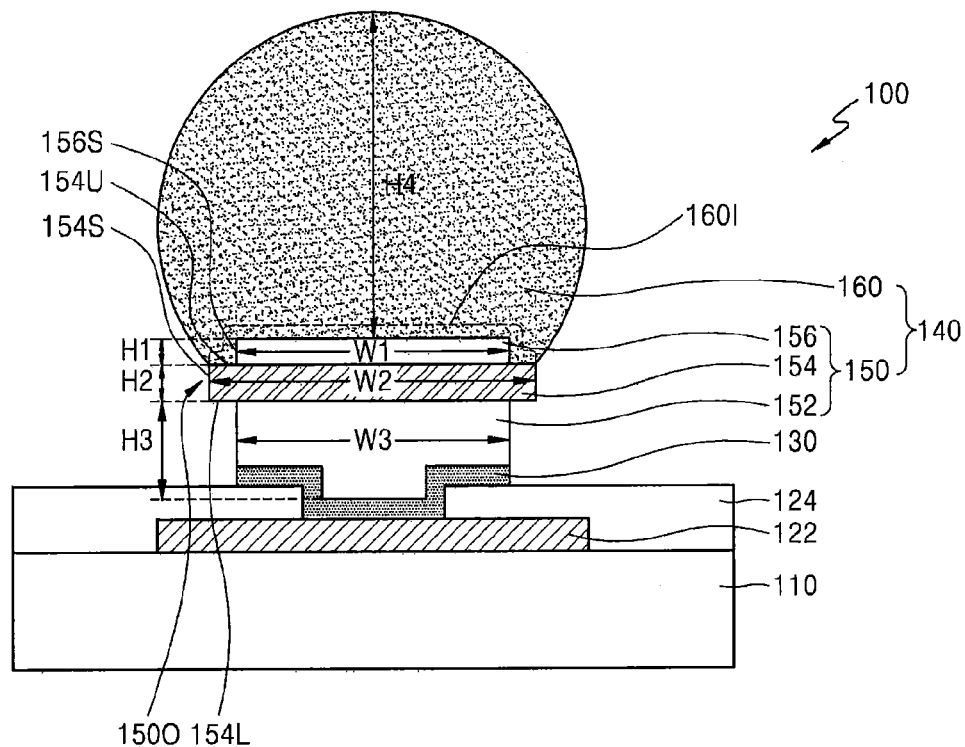
FIG. 2 is a cross-sectional view of a semiconductor chip according to example embodiments.

FIG. 2 is a cross-sectional view of the semiconductor chip 100 according to example embodiments. Referring to FIG. 2 along with FIG. 1, the conductive pad 122 may be disposed on a top surface of the semiconductor substrate 110. The conductive pad 122 may include aluminium (Al), tungsten (W), copper (Cu), nickel (Ni), or a combination thereof. Although not shown in FIG. 2, the conductive pad 122 may be electrically connected to individual unit elements (not shown) for a circuit unit of the semiconductor device 1 formed on the semiconductor substrate 110.

The passivation layer 124 may be disposed on the top surface of the semiconductor substrate 110 and may cover a part of a top surface of the conductive pad 122. The passivation layer 124 may include an insulating material such as photosensitive polyimide (PSPI), silicon nitride, or silicon oxide. The passivation layer 124 may act as a protective film for protecting the individual unit elements formed on the semiconductor substrate 110 from external impact or moisture. The passivation layer 124 may have an opening 124H, and a part of the top surface of the conductive pad 122 may be exposed through the opening 124H (See, e.g., FIG. 7).

A lower metal layer 130 may cover parts of the conductive pad 122 and the passivation layer 124 that is disposed adjacent to the conductive pad 122. The lower metal layer 130 may be formed between the connection terminal 140 and the conductive pad 122 and may be a seed layer, an adhesive layer, and/or a barrier layer for forming the connection terminal 140. In example embodiments, the lower metal layer 130 may include chromium (Cr), tungsten (W), titanium (Ti), copper (Cu), nickel (Ni), aluminium (Al), palladium (Pd), gold (Au), or a combination thereof.

Although the lower metal layer 130 is one layer in FIG. 2, the lower metal layer 130 may have a stacked structure including a plurality of metal layers. For example, the lower metal layer 130 may include a first metal layer, a second metal layer, and/or a third metal layer that are sequentially stacked on the conductive pad 122 and the passivation layer 124. The first metal layer may act as an adhesive layer for stably attaching the connection terminal 140 that is formed over the first metal layer to the conductive pad 122 and/or the passivation layer 124. The first metal layer may include a metal material that may be easily adhered to the passivation layer 124. For example, the first metal layer may include at least one of Ti, Ti—W, Cr, and Al. The second metal layer may act as a barrier layer for preventing a metal material included in the connection terminal 140 from being diffused into the semiconductor substrate 110 that is formed under the second metal layer. The second metal layer may include at least one of Cu, Ni Cr—Cu, and Ni-vanadium (V). The third meal layer may act as a wetting layer for improving wetting properties of a seed layer or a solder layer for forming the connection terminal 140. The third metal layer may include at least one of Ni, Cu, and Al.

The connection terminal 140 may be disposed on the lower metal layer 130, and the lower metal layer 130 may be disposed between the connection terminal 140 and the conductive pad 122. The connection terminal 140 may include the conductive pillar structure 150 and the solder layer 160.

The conductive pillar structure 150 may include a lower pillar layer 152, a diffusion barrier layer 154, and an upper pillar layer 156 that are sequentially stacked on the lower metal layer 130. The lower pillar layer 152 may be disposed on the lower metal layer 130, and a side wall of the lower pillar layer 152 may be aligned with a side wall of the lower metal layer 130. The lower pillar layer 152 may include Ni, Cu, Pd, platinum (Pt), Au, or a combination thereof. The diffusion barrier layer 154 may be disposed on the lower pillar layer 152. The diffusion barrier layer 154 may include Ni, cobalt (Co), Cu, or a combination thereof. The upper pillar layer 156 may be disposed on the diffusion barrier layer 154 and may include Ni, Cu, Pd, Pt, Au, or a combination thereof.

In example embodiments, the upper pillar layer 156 and the diffusion barrier layer 154 may include different materials. Also, the upper pillar layer 156 and the diffusion barrier layer 154 may include different materials having an etch selectivity with respect to each other. However, the inventive concept is not limited thereto. The upper pillar layer 156 and the lower pillar layer 152 may include the same material. However, the inventive concept is not limited thereto, and the upper pillar layer 156 and the lower pillar layer 152 may include different materials.

As shown in FIG. 2, the upper pillar layer 156 may have a first width W1, and the first width W1 may be less than a second width W2 of the diffusion barrier layer 154. For example, the first width W1 of the upper pillar layer 156 may range from, but is not limited to, about 80% to about 98% of the second width W2 of the diffusion barrier layer 154. Also, a third width W3 of the lower pillar layer 152 may be less than the second width W2 of the diffusion barrier layer 154. For example, the third width W3 of the lower pillar layer 152 may range from, but is not limited to, about 80% to about 98% of the second width W2 of the diffusion barrier layer 154.

Since the first width W1 of the upper pillar layer 156 is less than the second width W2 of the diffusion barrier layer 154, a part of a top surface of the diffusion barrier layer 154 may not be covered by the upper pillar layer 156. The part of the top surface of the diffusion barrier layer 154 not covered by the upper pillar layer 156, that is, a top surface of an outer circumference of the diffusion barrier layer 154, is referred to as an edge top surface 154U of the diffusion barrier layer 154. The edge top surface 154U of the diffusion barrier layer 154 may protrude outward from a side wall of the conductive pillar structure 150.

Also, since the third width W3 of the lower pillar layer 152 is less than the second width W2 of the diffusion barrier layer 154, a part of a bottom surface of the diffusion barrier layer 154 may not be covered by the lower pillar layer 152. Accordingly, a protrusion 150O of the diffusion barrier layer 154 may be defined by the edge top surface 154U, a side wall 154S, and an edge bottom surface 154L (that is, the part of the bottom surface of the diffusion barrier layer 154 not contacting the lower pillar layer 152) of the diffusion barrier layer 154. The protrusion 150O may protrude outward from the side wall of the conductive pillar structure 150.

The upper pillar layer 156 may have a first height H1, the diffusion barrier layer 154 may have a second height H2, and each of the first and second heights H1 and H2 may range from about 2 micrometers to about 30 micrometers. The lower pillar layer 152 may have a third height H3, and the third height H3 may range from about 5 micrometers to about 100 micrometers. However, the inventive concept is not limited thereto. The first through third heights H1, H2, and H3 may be appropriately selected according to a thickness and/or a width of the semiconductor chip 100, a pitch of the conductive pad 122, and a type of a material included in each of the upper pillar layer 156, the diffusion barrier layer 154, and/or the lower pillar layer 152.

The solder layer 160 may be disposed on at least a part of the edge top surface 154U of the diffusion barrier layer 154 and a side wall 156S and a top surface of the upper pillar layer 156. In example embodiments, the solder layer 160 may have a spherical or ball shape. The solder layer 160 may include tin (Sn), indium (In), bismuth (Bi), antimony (Sb), Cu, silver (Ag), zinc (Zn), lead (Pb), and/or an alloy thereof. For example, the solder layer 160 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

As shown in FIG. 2, the solder layer 160 may cover the entire top surface and the entire side wall 156S of the upper pillar layer 156, and may be disposed substantially on an entire area of the edge top surface 154U of the diffusion barrier layer 154. Accordingly, when compared to a case where a solder layer is disposed on a conductive pillar structure having a cylindrical shape (that is, a case where a solder layer is disposed on a top surface of a conductive pillar structure having a cylindrical shape on which the protrusion 150O is not formed), a contact area between the solder layer 160 and the conductive pillar structure 150 may be increased. Accordingly, an amount (or a height) of the solder layer 160 that may be disposed on the conductive pillar structure 150 without collapsing may be increased.

In general, as an amount of a solder layer increases, sufficient electrical connection may be provided due to the solder layer when a semiconductor chip is attached to a package substrate or a connection pad. In particular, a process for attaching a semiconductor chip to a package substrate may be performed at a temperature high enough for a part of a solder layer to melt, and the semiconductor chip may warp at this high temperature. When an amount of the solder layer is relatively small, the solder layer disposed on an edge portion of the semiconductor chip that warps may not contact the package substrate, thereby failing to provide reliable electrical connection between the semiconductor chip and the package substrate. Accordingly, the larger the solder layer, the more reliable electrical connection with the package substrate. However, since the solder layer is formed to have a spherical (or ball shape) due to a reflow process, an amount of the solder layer that may be disposed on a conductive pillar structure is limited by an area of a top surface of the conductive pillar structure. If an amount of the solder layer is too large, the solder layer may melt during a reflow process and may flow downward along a side wall of the conductive pillar structure, or the solder layer may collapse and an amount of the solder layer disposed on the conductive pillar structure may be further reduced.

As described above, the solder layer 160 may cover the entire top surface and the entire side wall 156S of the upper pillar layer 156, and may be disposed substantially on the entire area of the edge top surface 154U of the diffusion barrier layer 154. Accordingly, a relatively large contact area may be secured between the solder layer 160 and the conductive pillar structure 150, and thus an amount (or height) of the solder layer 160 that may be disposed on the conductive pillar structure 150 without collapsing may be relatively large.

An intermediate layer 160I, which is shown by dotted lines, may be formed on a contact interface between the solder layer 160 and the conductive pillar structure 150. The intermediate layer 160I may include an intermetallic compound (IMC) that is formed by a reaction between metal materials included in the solder layer 160 and the conductive pillar structure 150 at a relatively high temperature. For example, when the conductive pillar structure 150 includes Cu and/or Ni and the solder layer 160 includes Sn and/or Cu, the intermediate layer 160I may include at least one of $(Cu,Ni)_6Sn_5$, $(Cu,Ni)_3Sn_4$, and $(Cu,Ni)_3Sn$. However, a material or a composition of the intermediate layer 160I is not limited thereto, and may vary according to a material of the conductive pillar structure 150, a material of the solder layer 160, and a temperature and a time of a reflow process.

When the IMC is formed to an appropriate thickness on the contact interface between the solder layer 160 and the conductive pillar structure 150, adhesive properties of the solder layer 160 may be improved and structural stability of the solder layer 160 may also be improved. As shown in FIG. 2, as the intermediate layer 160I is formed in portions of the solder layer 160 contacting the top surface and the side wall 156S of the upper pillar layer 156 and the edge top surface 154U of the diffusion barrier layer 154, the intermediate layer 160I may have a relatively large surface area. In particular, when comparing to a case where a solder layer is disposed on a conductive pillar structure having a cylindrical shape (that is, a case where a solder layer is disposed on a top surface of a conductive pillar structure having a cylindrical shape on which the protrusion 150O is not formed), the intermediate layer 160I may have a relatively large surface area. In general, the intermediate layer 160I may include a material having a melting point higher than that of the solder layer 160, or may include a material having a mechanical strength greater than that of the solder layer 160. Accordingly, when a surface area of the intermediate layer 160I is relatively large, an amount of the solder layer 160 that may be disposed on the conductive pillar structure 150 without collapsing may be relatively large.

In example embodiments, the solder layer 160 may have a fourth height H4 from a top surface of the conductive pillar structure 150. For example, the fourth height H4 of the solder layer 160 may range from about 50% to about 90% of the second width W2 of the diffusion barrier layer 154. When the fourth height H4 is less than 50% and the semiconductor chip 100 warps, it may be difficult to provide reliable electrical connection with the connection pad 220. When the fourth height H4 is greater than 90%, the solder layer 160 may flow downward along the side wall of the conductive pillar structure 150 or may collapse during a reflow process. However, the inventive concept is not limited thereto.

In example embodiments, the second width W2 of the diffusion barrier layer 154 may be greater than the first width W1 of the upper pillar layer 156 and/or the third width W3 of the lower pillar layer 152, and the fourth height H4 of the solder layer 160 may range from about 50% to about 90% of the second width W2 of the diffusion barrier layer 154. Accordingly, the fourth height H4 of the solder layer 160 may be relatively large, and thus a volume of the solder layer 160 may also be relatively large.

The protrusion 150O may prevent the solder layer 160 from flowing downward along the side wall of the conductive pillar structure 150 during a reflow process of the solder layer 160 or a process for attaching the solder layer 160 to an external connection pad. In particular, the processes may be performed at a temperature high enough for a part of the solder layer 160 to melt, and in this case, the mobility of the solder layer 160 may be increased. If the part of the solder layer 160 flows downward along the side wall of the conductive pillar structure 150, the solder layer 160 may mostly react with the side wall of the lower pillar layer 152 to further form an undesired IMC, and thus an amount of the solder layer 160 disposed on the top surface of the conductive pillar structure 150 may be further reduced. Also, once the undesired IMC is formed, a void may be formed in the solder layer 160, and when the semiconductor chip 100 is used for a long time, the reliability of the connection terminal 140 may be reduced due to the void.

As shown in FIG. 2, the conductive pillar structure 150 may include the protrusion 150O formed on the side wall, and the protrusion 150O may be defined by the edge top surface 154U, the side wall 154S, and the edge bottom surface 154L of the diffusion barrier layer 154. A flow path, through which the solder layer 160 disposed on the conductive pillar structure 150 flows downward along the protrusion 150O of the conductive pillar structure 150, may include the side wall 154S and the edge bottom surface 154L of the diffusion barrier layer 154, and thus may be relatively long. Accordingly, a phenomenon in which the solder layer 160 flows downward along the side wall of the conductive pillar structure 150 or a void is accordingly formed in the solder layer 160 may be avoided.

As shown in FIG. 2, the intermediate layer 160I having a predetermined thickness may be formed on a contact interface between the conductive pillar structure 150 and the solder layer 160 (that is, a contact interface between the solder layer 160, and the top surface and the side wall 156S of the upper pillar layer 156 and the edge top surface 154U of the diffusion barrier layer 154). Since the intermediate layer 160I may be formed on an edge portion of the solder layer 160 contacting the top surface of the diffusion barrier layer 154, an IMC may be formed to a predetermined thickness on a lowermost surface of the solder layer 160 contacting the top surface of the diffusion barrier layer 154. As described above, since the intermediate layer 160I may include a material having a melting point or a mechanical strength greater than that of the solder layer 160 and the intermediate layer 160I is formed on the edge portion of the solder layer 160, a phenomenon in which the solder layer 160 flows downward along the side wall of the conductive pillar structure 150 or a void is accordingly formed in the solder layer 160 may be avoided.

According to the semiconductor chip 100, the solder layer 160 may contact a top surface of the protrusion 150O of the conductive pillar structure 150. A contact area between the solder layer 160 and the conductive pillar structure 150 may be relatively large, and thus an amount or a height of the solder layer 160 that may be disposed on the conductive pillar structure 150 without collapsing may be increased. Also, the protrusion 150O may prevent the solder layer 160 from flowing downward along the side wall of the conductive pillar structure 150 during a reflow process of the solder layer 160 or a process for attaching the solder layer 160 to an external connection pad. Accordingly, the semiconductor chip 100 may provide reliable electrical connection.

Figure 3:
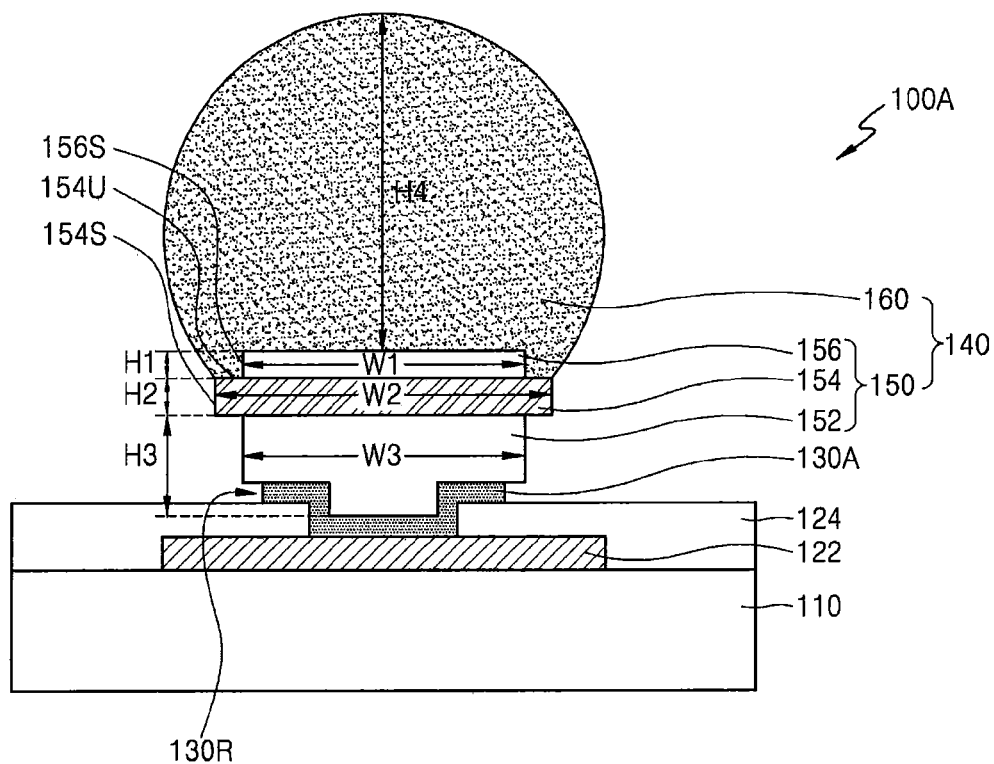
FIG. 3 is a cross-sectional view of a semiconductor chip according to example embodiments.

FIG. 3 is a cross-sectional view of a semiconductor chip 100A according to example embodiments. In FIG. 3, the same reference numerals as those in FIGS. 1 and 2 denote the same elements. Referring to FIG. 3, an undercut 130R may be formed around a lower metal layer 130A by removing a part of the lower metal layer 130A under a side wall of the conductive pillar structure 150. A side wall of the lower metal layer 130A may not be aligned with the side wall of the conductive pillar structure 150 and may be disposed more inward than the side wall of the conductive pillar structure 150.

In an example process for forming the lower metal layer 130A, the lower metal layer 130A may be formed by forming a preliminary lower metal layer 130P that covers the conductive pad 122 and the passivation layer 124, forming the conductive pillar structure 150 on the preliminary lower metal layer 130P, and removing a portion of the preliminary lower metal layer 130P not covered by the conductive pillar structure 150 by using the conductive pillar structure 150 as an etching mask. For example, the portion of the preliminary lower metal layer 130P may be removed by using a wet etching process using an etchant, and an etching speed of the lower metal layer 130A in the etchant may be relatively high. In this case, the lower metal layer 130A under the side wall of the conductive pillar structure 150 may be further etched by a predetermined width, and thus the undercut 130R may be formed around the lower metal layer 130A.

Although the undercut 130R has a vertical side wall in FIG. 3, the inventive concept is not limited thereto and the undercut 130R may have an inclined side wall. For example, the lower metal layer 130A may have a stacked structure including a plurality of metal layers, for example, a first metal layer, a second metal layer, and/or a third metal layer that are sequentially stacked on the conductive pad 122 and the passivation layer 124. When metal materials included in the first metal layer, the second metal layer, and/or the third metal layer are different from one another, etching speeds of the first metal layer, the second metal layer, and/or the third metal layer in an etchant in a process for forming the lower metal layer 130A may be different from one another. In this case, the first metal layer, the second metal layer, and/or the third metal layer may be etched by different widths, and thus the undercut 130R may have an inclined side wall.

Figure 4:
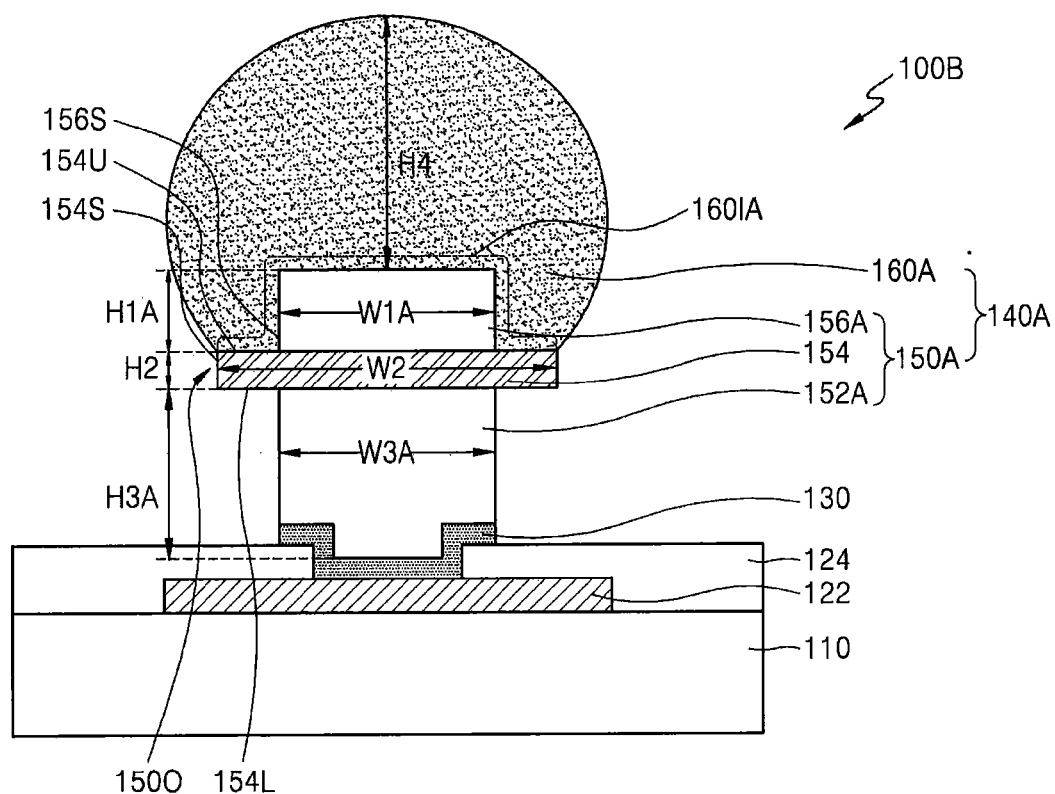
FIG. 4 is a cross-sectional view of a semiconductor chip according to example embodiments.

FIG. 4 is a cross-sectional view of a semiconductor chip 100B according to example embodiments. In FIG. 4, the same reference numerals as those in FIGS. 1 through 3 denote the same elements. Referring to FIG. 4, a conductive pillar structure 150A may have a relatively large height. The protrusion 150O may be formed on a side wall of the conductive pillar structure 150A, and a width of the protrusion 150O may also be relatively large.

In example embodiments, a first width W1A of an upper pillar layer 156A may range from about 30% to about 80% of the second width W2 of the diffusion barrier layer 154. A first height H1A of the upper pillar layer 156A may be greater than the second height H2 of the diffusion barrier layer 154. However, the inventive concept is not limited thereto.

The first width W1A of the upper pillar layer 156A may range from about 30% to about 80% of the second width W2 of the diffusion barrier layer 154, and thus the edge top surface 154U of the diffusion barrier layer 154 not covered by the upper pillar layer 156A may have a further large width. Also, since the first height H1A of the upper pillar layer 156A is relatively large, a contact area between the conductive pillar structure 150A and a solder layer 160A (or a contact area between the solder layer 160A, and the top surface and the side wall 156S of the upper pillar layer 156A and the edge top surface 154U of the diffusion barrier layer 154) may be further increased. Accordingly, an amount of the solder layer 160A that may be disposed on the conductive pillar structure 150A without collapsing may be relatively large.

As shown in FIG. 4, an intermediate layer 160IA may be formed on a contact interface between the conductive pillar structure 150A and the solder layer 160A, and a surface area of the intermediate layer 160IA may be relatively large. The intermediate layer 160IA may include an IMC such as $(Cu,Ni)_6Sn_5$, $(Cu,Ni)_3Sn_4$, or $(Cu,Ni)_3Sn$. The intermediate layer 160IA may include a material having a melting point or a mechanical strength greater than that of the solder layer 160A, and thus an amount of the solder layer 160A that may be disposed on the conductive pillar structure 150A without collapsing may be further increased.

In example embodiments, a third width W3A of a lower pillar layer 152A may range from about 30% to about 80% of the second width W2 of the diffusion barrier layer 154. Also, a third height H3A of the lower pillar layer 152A may be greater than the second height H2 of the diffusion barrier layer 154 or the first height H1A of the upper pillar layer 156A.

The third width W3A of the lower pillar layer 152A may range from about 30% to about 80% of the second width W2 of the diffusion barrier layer 154, and thus the edge bottom surface 154L of the diffusion barrier layer 154 not contacting the lower pillar layer 152A may have a further large width. Accordingly, a flow path through which the solder layer 160A flows downward along the side wall of the conductive pillar structure 150A in a reflow process or a process for attaching a connection terminal 140A to an external connection pad may be further increased, and thus a phenomenon in which the solder layer 160A flows downward along the side wall of the conductive pillar structure 150A or a void is accordingly formed in the solder layer 160A may be avoided.

Since the third width W3A of the lower pillar layer 152A is less the second width W2 of the diffusion barrier layer 154 or a width of the solder layer 160A, a distance between adjacent lower pillar layers 152A may be increased. Since a pitch of the conductive pad 122 is reduced in the semiconductor chip 100 having a micro pitch, a distance between adjacent conductive pillar structures 150A is also reduced. However, in the semiconductor chip 100B of FIG. 4, a distance between adjacent lower pillar layers 152A may be greater than a distance between adjacent diffusion barrier layers 154 or a distance between adjacent solder layers 160A. That is, even when a pitch of the conductive pad 122 is reduced, a relatively large space may be secured around the lower pillar layer 152A due to the third width W3A, which is small, and the third height H3A, which is large, of the lower pillar layer 152A. When the semiconductor chip 100B is attached to the connection pad 220 (see FIG. 1) of the package substrate 200 (see FIG. 1) and then the underfill layer 170 (see FIG. 1) that surrounds side walls of the solder layer 160A and the conductive pillar structure 150A is formed, the underfill layer 170 may be filled with no void in the relatively large space around the lower pillar layer 152A.

As described above, an example process for attaching a semiconductor chip to a package substrate may be performed at a temperature high enough for a part of a solder layer to melt, and the semiconductor chip may warp at this high temperature. When a height of a connection terminal is small, the solder layer disposed on an edge portion of the semiconductor chip when the semiconductor chip warps may not contact the package substrate, thereby failing to provide reliable electrical connection between the semiconductor chip and the package substrate. However, in the semiconductor chip 100B of FIG. 4, a fourth height H4A of the solder layer 160A may be relatively large and a height of the conductive pillar structure 150A (that is, a sum of the first through third heights H1A, H2, and H3A) may be relatively large. Accordingly, even when the semiconductor chip 100B warps at a high temperature, the solder layer 160A disposed on an edge portion of the semiconductor chip 100B may sufficiently contact the package substrate 200, thereby providing reliable electrical connection between the semiconductor chip 100B and the package substrate 200.

Figure 5:
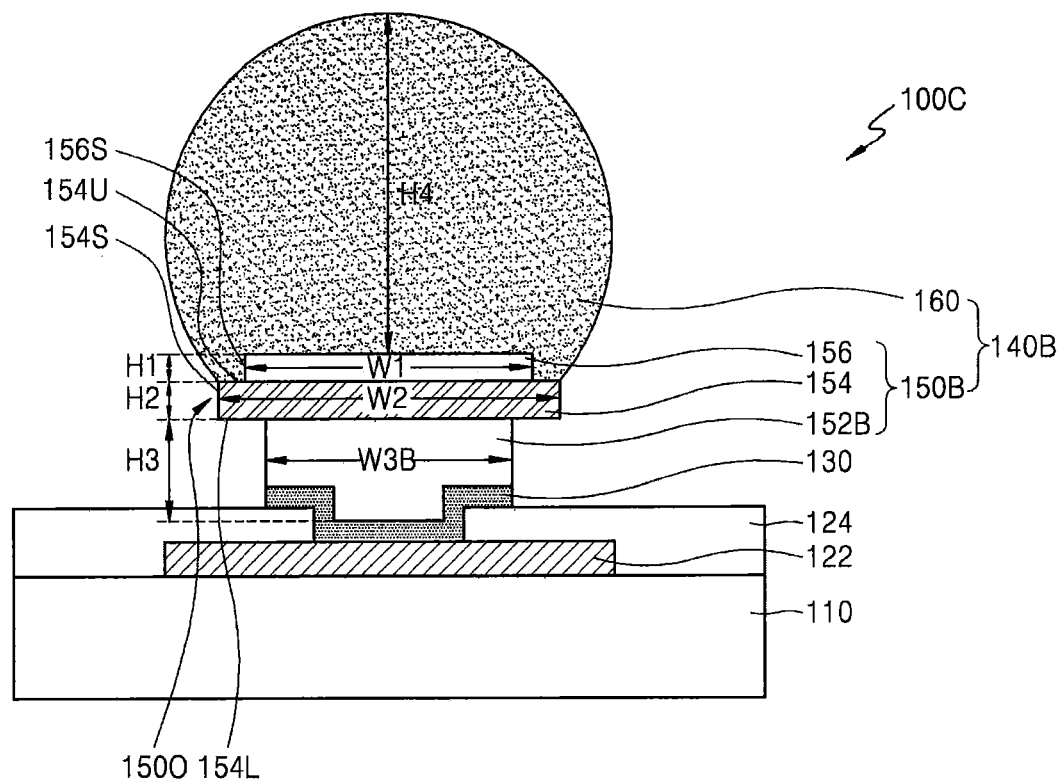
FIG. 5 is a cross-sectional view of a semiconductor chip according to example embodiments.

FIG. 5 is a cross-sectional view of a semiconductor chip 100C according to example embodiments. In FIG. 5, the same reference numerals as those in FIGS. 1 through 4 denote the same elements. Referring to FIG. 5, a lower pillar layer 152B may have a third width W3B, and the third width W3B may be less than the first width W1 of the upper pillar layer 156. Since the third width W3B of the lower pillar layer 152B is less than the first width W1 of the upper pillar layer 156, when the semiconductor chip 100C is attached to the connection pad 220 (see FIG. 1) of the package substrate 200 (see FIG. 1) and then the underfill layer 170 (see FIG. 1) that surrounds side walls of the solder layer 160 and a conductive pillar structure 150B is formed, the underfill layer 170 may be filled with no void in a relatively large space around the lower pillar layer 152B.

In example embodiments, the lower pillar layer 152B may include a material different from that of the upper pillar layer 156. In an example process for forming the lower metal layer 130, the lower metal layer 130 may be formed by forming the preliminary lower metal layer 130P (see FIG. 8) that covers the conductive pad 122 and the passivation layer 124, forming the conductive pillar structure 150B on the preliminary lower metal layer 130P, and then removing a portion of the preliminary lower metal layer 130P not covered by the conductive pillar structure 150B by using the conductive pillar structure 150B as an etching mask. For example, the portion of the preliminary lower metal layer 130P may be removed by using a wet etching process using an etchant, and the side wall of the conductive pillar structure 150B exposed to the etchant may also be removed by a predetermined width. For example, the lower pillar layer 152B and the upper pillar layer 156 may include different materials, and etching speeds of the lower pillar layer 152B and the upper pillar layer 156 in the etchant may be different from each other. In particular, when the etching speed of the lower pillar layer 152B is higher than the etching speed of the upper pillar layer 156, the third width W3B of the lower pillar layer 152B may be less than the first width W1 of the upper pillar layer 156 as shown in FIG. 5. However, the inventive concept is not limited thereto. When the etching speed of the lower pillar layer 152B is lower than the etching speed of the upper pillar layer 156, the semiconductor chip 100C in which the third width W3B of the lower pillar layer 152B is greater than the first width W1 of the upper pillar layer 1656 may be obtained, unlike in FIG. 5.

In other example embodiments, the lower pillar layer 152B may include the same material as that of the upper pillar layer 156. For example, etching speeds of the upper pillar layer 156 and the lower pillar layer 152B in the etchant during the wet etching process for forming the lower metal layer 130 may be substantially the same or similar to each other, and the upper pillar layer 156 and the lower pillar layer 152B may respectively have the first width W1 and the third width W3 (see FIG. 2) that are substantially the same. Thereafter, a reflow process for forming the solder layer 160 having a spherical shape is performed, and then an additional etching process may be performed. Since the side wall 156S and the top surface of the upper pillar layer 156 are covered by the solder layer 160, the upper pillar layer 156 may not be etched in the additional etching process. A side wall of the lower pillar layer 152B may be exposed to an etchant used in the additional etching process, and may be removed by a predetermined width. Accordingly, the third width W3B of the lower pillar layer 152B may be less than the first width W1 of the upper pillar layer 156 as shown in FIG. 5.

Figure 6:
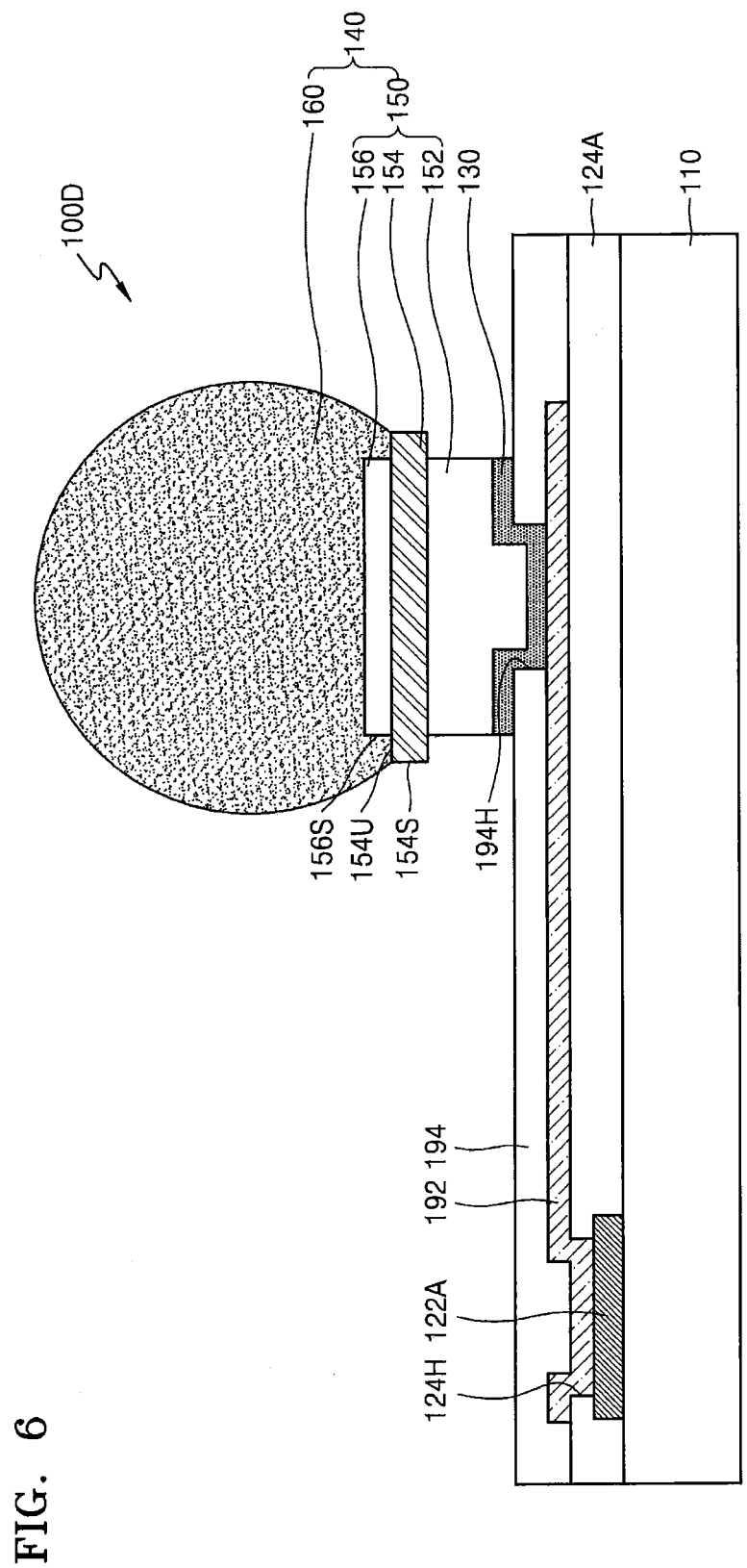
FIG. 6 is a cross-sectional view of a semiconductor chip according to example embodiments.

FIG. 6 is a cross-sectional view of a semiconductor chip 100D according to example embodiments. In FIG. 6, the same reference numerals as those in FIGS. 1 through 5 denote the same elements. Referring to FIG. 6, a conductive pad 122A may be formed on the semiconductor substrate 110, and a passivation layer 124A having an opening 124H through which a part of a top surface of the conductive pad 122A is exposed may be formed.

A redistribution layer 192 may be formed on the conductive pad 122A and the passivation layer 124A. The redistribution layer 192 may cover a side wall and the bottom of the opening 124H and may extend to be disposed over the passivation layer 124A. The redistribution layer 192 may include Cu, Al, W, Ni, Ti, titanium nitride (TiN), tantalum (Ta), tantalum nitride (TaN), Au, or a combination thereof.

A redistribution insulating layer 194 having an opening 194H through which a part of a top surface of the redistribution layer 192 is exposed may be disposed on the redistribution layer 192. The redistribution insulating layer 194 may include photosensitive polyimide, silicon nitride, silicon oxide, silicon oxynitride, or a combination thereof.

The lower metal layer 130 may be formed on the redistribution insulating layer 194. The lower metal layer 130 may cover a side wall and the bottom of the opening 194H of the redistribution insulating layer 194 and may be electrically connected to the redistribution layer 192. The connection terminal 140 may be disposed on the lower metal layer 130 and may include the conductive pillar structure 150 and the solder layer 160. The lower metal layer 130, the conductive pillar structure 150, and the solder layer 160 have similar technical features as those described with reference to FIG. 2. Also, the lower metal layer 130 may be replaced by the lower metal layer 130A of FIG. 3, and the connection terminal 140 may be replaced by the connection terminals 140A and 140B of FIGS. 4 and 5.

According to the semiconductor chip 100D, the connection terminal 140 may be disposed on the redistribution layer 192 electrically connected to the conductive pad 122A. Accordingly, even when the conductive pad 122A has a micro pitch in the semiconductor chip 100D having a micro pitch, the connection terminal 140 may be disposed on the redistribution layer 192 to have a relatively large pitch. Also, a layout of the redistribution layer 192 may be independent from a layout of the conductive pad 122A. Accordingly, the semiconductor chip 100D may have improved flexibility.

Figure 7:
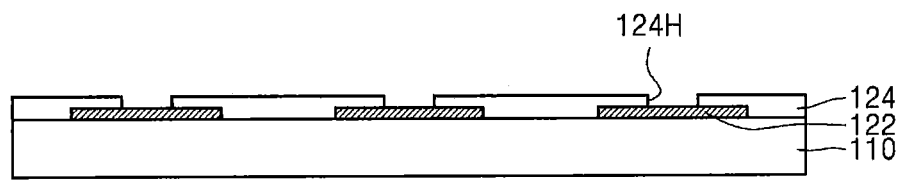
FIGS. 7 through 13 are cross-sectional views for explaining methods of manufacturing semiconductor chips according to example embodiments.

FIGS. 7 through 13 are cross-sectional views for explaining a method of manufacturing a semiconductor chip according to example embodiments. FIGS. 7 through 13 may be cross-sectional views for explaining a method of manufacturing the semiconductor chip 100 of FIG. 2. In FIGS. 7 through 13, the same reference numerals as those in FIGS. 1 through 6 denote the same elements. Referring to FIG. 7, a conductive layer (not shown) may be formed on the semiconductor substrate 110, and then the conductive pad 122 may be formed on the semiconductor substrate 110 by patterning the conductive layer. A plurality of the conductive pads 122 may be disposed at predetermined intervals according to a pitch of the semiconductor chip.

An insulating layer (not shown) may be formed on the conductive pad 122 and the semiconductor substrate 110, and then the passivation layer 124 having the opening 124H therein, which exposes part of a top surface of the conductive pad 122, may be formed by patterning the insulating layer.

Figure 8:
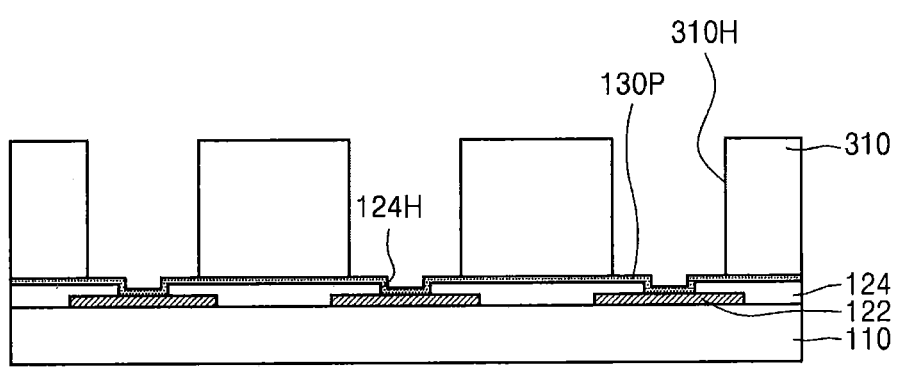

Referring to FIG. 8, the preliminary lower metal layer 130P may be formed on the top surface of the conductive pad 122 exposed through the opening 124H and on a top surface of the passivation layer 124. In example embodiments, the preliminary lower metal layer 130P may be formed by using a sputtering process or a chemical vapor deposition (CVD) process. The preliminary lower metal layer 130P may be formed to conform to a side wall and the bottom of the opening 124H, and thus the opening 124H may not be completely filled.

Although the preliminary lower metal layer 130P is one layer in FIG. 8, the preliminary lower meta layer 130P may have a stacked structure including a plurality of metal layers. For example, the preliminary lower metal layer 130P may include first through third metal layers, and each of the first through third metal layers may respectively act as an adhesive layer, a barrier layer, a seed layer, or a wetting layer. Technical features of the preliminary lower metal layer 130P are similar to those of the lower metal layer 130 described with reference to FIG. 2.

Next, a mask layer 310 having an opening 310H may be formed on the preliminary lower metal layer 130P. The mask layer 310 may be a photoresist pattern.

The opening 310H may be formed to vertically overlap the conductive pad 122. The opening 310H may have any of various shapes such as a cylindrical shape, a rectangular prism shape, or a polyprism shape. A horizontal width of the opening 310H may be, but is not limited to, substantially the same as the second width W2 (see FIG. 2) of the diffusion barrier layer 154.

Figure 9:
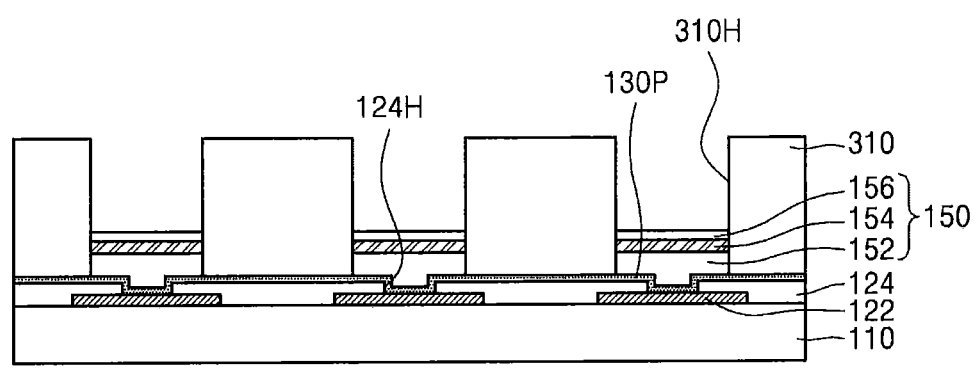

Referring to FIG. 9, the conductive pillar structure 150 may be formed by sequentially forming the lower pillar layer 152, the diffusion barrier layer 154, and the upper pillar layer 156 in the opening 310H. A top surface of the upper pillar layer 156 may be at a level lower than that of a top surface of the mask layer 310, and thus the opening 310H may not be completely filled.

In example embodiments, the lower pillar layer 152 having a predetermined height from the bottom of the opening 310H may be formed by using a first electroplating process, the diffusion barrier layer 154 having a predetermined height may be formed on the lower pillar layer 152 by using a second electroplating process, and the upper pillar layer 156 may be formed on the diffusion barrier layer 154 by using a third electroplating process.

In other example embodiments, the lower pillar layer 152 having a predetermined height from the bottom of the opening 310H may be formed by using a first electroplating process, the diffusion barrier layer 154 having a predetermined height may be formed on the lower pillar layer 152 by using a sputtering process, and the upper pillar layer 156 may be formed on the diffusion barrier layer 154 by using a second electroplating process.

In example embodiments, the lower pillar layer 152 may include Ni, Cu, Pd, Pt, Au, or a combination thereof. The diffusion barrier layer 154 may be formed on the lower pillar layer 152. The diffusion barrier layer 154 may include Ni, Co, Cu, or a combination thereof. The upper pillar layer 156 may include Ni, Cu, Pd, Pt, Au, or a combination thereof. In example embodiments, the lower pillar layer 152 and/or the upper pillar layer 156 may include a material having an etch selectivity with respect to the diffusion barrier layer 154. For example, the lower pillar layer 152 and the upper pillar layer 156 may be formed of Cu and the diffusion barrier layer 154 may be formed of Ni. However, the inventive concept is not limited thereto.

Figure 10:
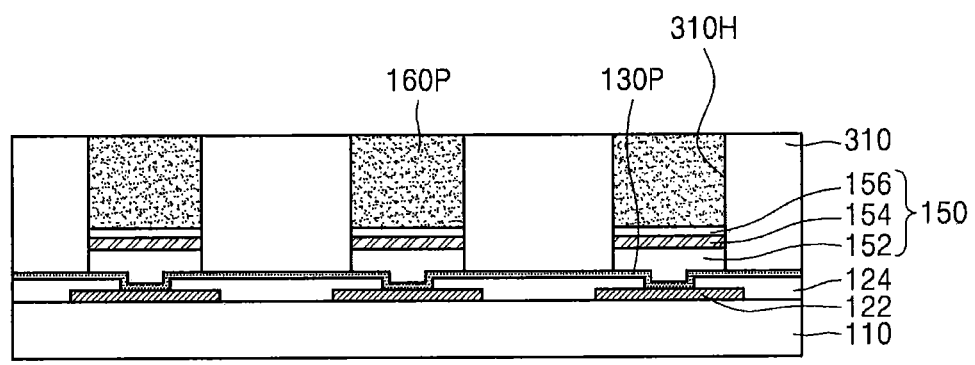

Referring to FIG. 10, a preliminary solder layer 160P may be formed on the upper pillar layer 156 in the opening 310H of the mask layer 310. In example embodiments, the preliminary solder layer 160P may be formed by using an electroplating process. The preliminary solder layer 160P may include Sn, In, Bi, Sb, Cu, Ag, Zn, Pb, and/or an alloy thereof. In example embodiments, the preliminary solder layer 160P may include a material having an etch selectivity with respect to the lower pillar layer 152 and/or the upper pillar layer 156.

A shape of the preliminary solder layer 160P may vary according to a height of the mask layer 310 or a volume of the preliminary solder layer 160P. In FIG. 10, a top surface of the preliminary solder layer 160P is substantially at the same level as that of the top surface of the mask layer 310. In this case, the preliminary solder layer 160P may have, but is not limited to, a circular disc shape having a flat top surface. Unlike in FIG. 10, the top surface of the preliminary solder layer 160P may be at a level higher than that of the top surface of the mask layer 310 and the preliminary solder layer 160P may have a mushroom-like shape, or the top surface of the preliminary solder layer 160P may be at a level lower than that of the top surface of the mask layer 310.

Figure 11:
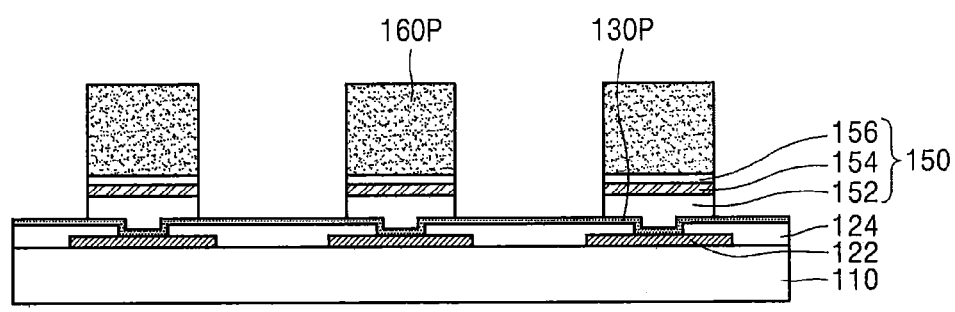

Referring to FIG. 11, the mask layer 310 (see FIG. 10) may be removed. An example process for removing the mask layer 310 may be an ashing process. As the mask layer 310 is removed, a top surface of the preliminary lower metal layer 130P and a side wall of the conductive pillar structure 150 may be exposed.

Figure 12:
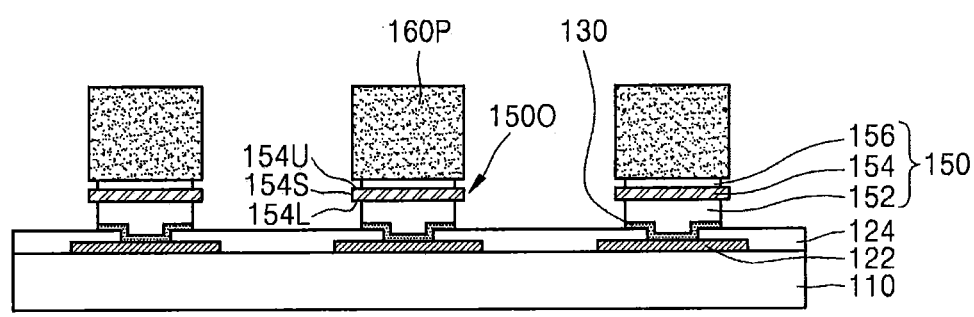

Referring to FIG. 12, the lower metal layer 130 may be formed by removing a portion of the preliminary lower metal layer 130P (see FIG. 11) not covered by the preliminary solder layer 160P and the conductive pillar structure 150.

In example embodiments, a process for removing the portion of the preliminary lower meal layer 130P may be a wet etching process. Side walls of the lower pillar layer 152 and the upper pillar layer 156 exposed to an etchant used in the wet etching process may also each be removed by a predetermined width.

In example embodiments, the upper pillar layer 156 and the lower pillar layer 152 may each include a material having an etch selectivity with respect to the diffusion barrier layer 154. In this case, the exposed side walls of the upper pillar layer 156 and the lower pillar layer 152 may each be etched by a predetermined width while an exposed side wall of the diffusion barrier layer 154 is hardly etched, and thus the protrusion 150O may be formed on the side wall of the conductive pillar structure 150. Alternatively, although all of the upper pillar layer 156, the diffusion barrier layer 154, and the lower pillar layer 152 may be removed by predetermined widths by the etchant, an amount of the diffusion barrier layer 154 that is removed may be less than amounts of the upper pillar layer 156 and the lower pillar layer 152 that are removed, and thus the protrusion 150O may be formed on the side wall of the conductive pillar structure 150.

As the exposed side walls of the upper pillar layer 156 and the lower pillar layer 152 are disposed more inward than the side wall of the diffusion barrier layer 154 in the etching process, the protrusion 150O may be defined by the edge top surface 154U, the side wall 154S, and the edge bottom surface 154L of the diffusion barrier layer 154.

The preliminary solder layer 160P may include, but is not limited to, a material having an etch selectivity with respect to the upper pillar layer 156 and the lower pillar layer 152. As the side wall of the lower pillar layer 152 is recessed to a predetermined width, a portion of the lower metal layer 130 disposed under the removed portion may also be exposed to the etchant, and thus may also be removed. Accordingly, a side wall of the lower metal layer 130 may be aligned with the side wall of the lower pillar layer 152 as shown in FIG. 12.

In order to manufacture the semiconductor chip 100C of FIG. 5, the lower pillar layer 152B and the upper pillar layer 156 may include different materials and etching speeds of the materials included in the lower pillar layer 152B and the upper pillar layer 156 in the etchant may be different from each other. In particular, when the etching speed of the material included in the lower pillar layer 152B is higher than the etching speed of the material included in the upper pillar layer 156, a side wall of the lower pillar layer 152B may be disposed more inward than the side wall of the upper pillar layer 156. In this case, the semiconductor chip 100C of FIG. 5 may be manufactured.

Figure 13:
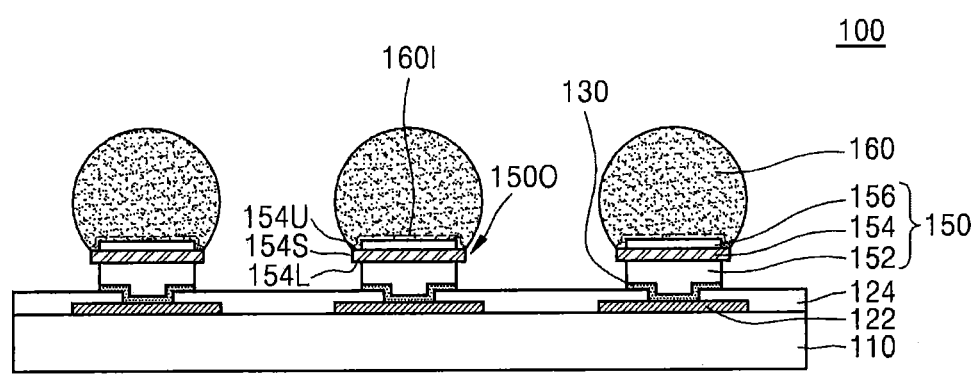

Referring to FIG. 13, the solder layer 160 having a spherical or ball shape may be formed by using a reflow process.

In example embodiments, when the preliminary solder layer 160P (see FIG. 12) reflows at a temperature lower than a melting point of the preliminary solder layer 160P, for example, at a temperature ranging from about 220° C. to about 250° C., the preliminary solder layer 160P may change to a liquid state. The solder layer 160 having a spherical or ball shape may be formed due to surface tension of the preliminary solder layer 160P in the liquid state. Materials included in the conductive pillar structure 150 may not change to liquid states in the reflow process, and a shape of the conductive pillar structure 150 may be remained.

In example embodiments, the solder layer 160 may flow downward along the side wall of the conductive pillar structure 150 and may contact the edge top surface 154U of the diffusion barrier layer 154. Accordingly, the solder layer 160 may cover the entire side wall and the entire top surface of the upper pillar layer 156, and may cover substantially an entire area of the edge top surface 154U of the diffusion barrier layer 154. However, the solder layer 160 may not be formed on the side wall 154S of the diffusion barrier layer 154.

In example embodiments, the intermediate layer 160I may be formed on a contact interface between the conductive pillar structure 150 and the solder layer 160 during the reflow process. The intermediate layer 160I may include an IMC formed by a reaction between a material included in the conductive pillar structure 150 and a material included in the solder layer 160.

The semiconductor chip 100 may be manufactured by performing the above processes.

According to the method of manufacturing the semiconductor chip 100, the conductive pillar structure 150 including the protrusion 150O on the side wall thereof may be formed, and an amount (or a height) of the solder layer 160 disposed on the conductive pillar structure 150 may be increased. The protrusion 150O of the conductive pillar structure 150 may prevent the solder layer 160 from flowing downward along the side wall. Accordingly, the semiconductor chip 100 may provide reliable electrical connection. Also, since the protrusion 150O may be formed on the side wall of the conductive pillar structure 150 when the lower metal layer 130 is formed, a process of manufacturing the semiconductor chip 100 may be simplified.

Figure 14:
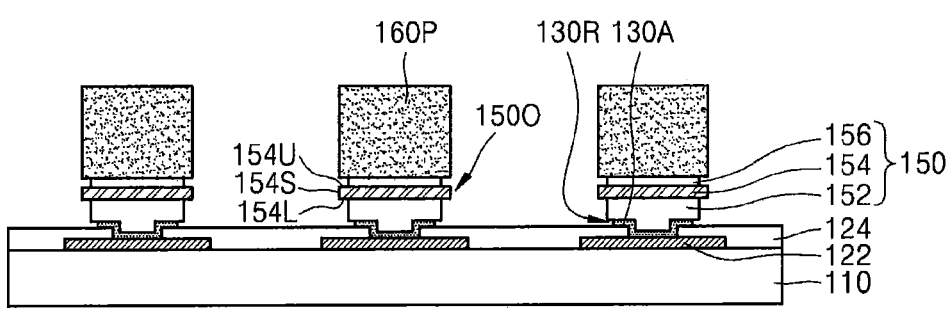
FIG. 14 is a cross-sectional view for explaining methods of manufacturing semiconductor chips according to example embodiments.

FIG. 14 is a cross-sectional view for explaining a method of manufacturing a semiconductor chip according to example embodiments. FIG. 14 may be a cross-sectional view for explaining a method of manufacturing the semiconductor chip 100A of FIG. 3. In FIG. 14, the same reference numerals as those in FIGS. 1 through 13 denote the same elements.

First, the conductive pillar structure 150 and the preliminary solder layer 160P may be sequentially stacked on the preliminary lower metal layer 130P by performing the above processes of FIGS. 7 through 11.

Referring to FIG. 14, the lower metal layer 130A may be formed by removing a portion of the preliminary lower metal layer 130P not covered by the preliminary solder layer 160P and the conductive pillar structure 150.

An etching speed of a material included in the lower metal layer 130A in the etchant may be higher than an etching speed of a material included in the lower pillar layer 152 in an etchant. In this case, an exposed portion of a side wall of the lower metal layer 130A may be further etched, and thus the undercut 130R may be formed around the lower metal layer 130A. The lower metal layer 130A may be disposed more inward than a side wall of the lower pillar layer 152.

Next, the semiconductor chip 100A may be manufactured by performing the above process of FIG. 13.

FIGS. 15 through 18 are cross-sectional views for explaining a method of manufacturing a semiconductor chip according to example embodiments. FIGS. 15 through 18 may be cross-sectional views for explaining a method of manufacturing the semiconductor chip 100B of FIG. 4. In FIGS. 15 through 18, the same reference numerals as those in FIGS. 1 through 14 denote the same elements.

First, the conductive pad 122, the passivation layer 124, and the preliminary lower metal layer 130P may be formed on the semiconductor substrate 110 by performing the above processes of FIGS. 7 and 8.

Figure 15:
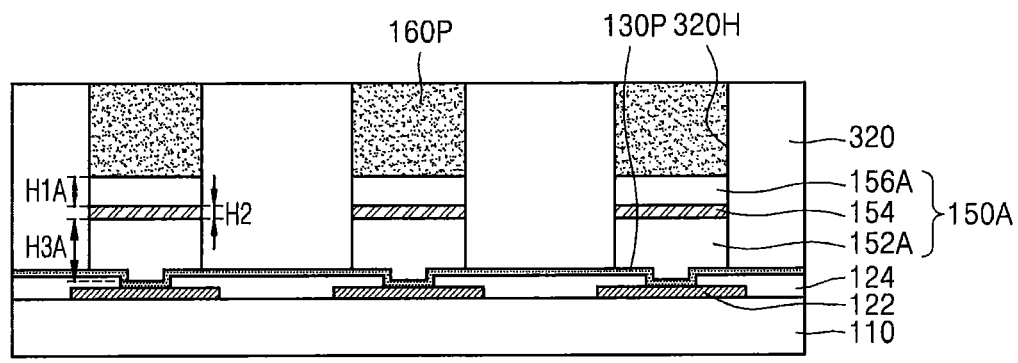
FIGS. 15 through 18 are cross-sectional views for explaining methods of manufacturing semiconductor chips according to example embodiments.

Referring to FIG. 15, a mask layer 320 having an opening 320H may be formed on the preliminary lower metal layer 130P. In this case, a height of the mask layer 320 may be greater than a height of the mask layer 310 of FIG. 8.

The conductive pillar structure 150A and the preliminary solder layer 160P may be sequentially stacked in the opening 320H of the mask layer 320 by performing the above processes of FIGS. 9 and 10.

The conductive pillar structure 150A may include the lower pillar layer 152A, the diffusion barrier layer 154, and the upper pillar layer 156A that are sequentially stacked. In example embodiments, the lower pillar layer 152A and the upper pillar layer 156A may each be formed by using a material having an etch selectivity with respect to the diffusion barrier layer 154. Also, the lower pillar layer 152A and the upper pillar layer 156A may each be formed by using a material having an etch selectivity with respect to the preliminary solder layer 160P. In example embodiments, the first height H1A of the upper pillar layer 156A may be greater than the second height H2 of the diffusion barrier layer 154, and the third height H3A of the lower pillar layer 152A may be greater than the second height H2 of the diffusion barrier layer 154.

Figure 16:
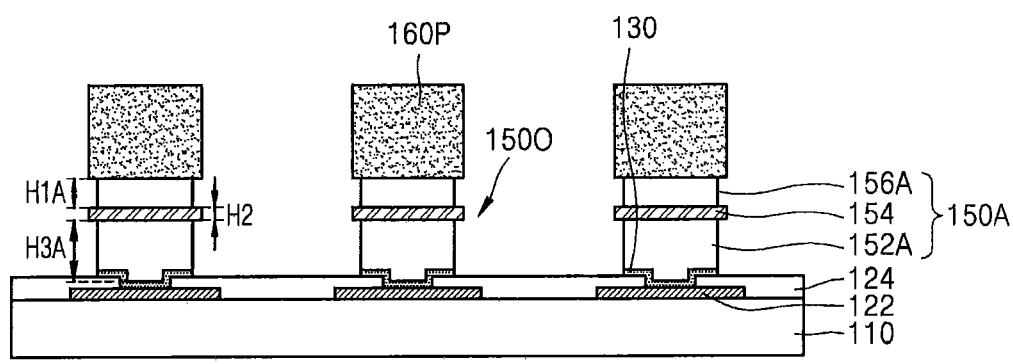

Referring to FIG. 16, the lower metal layer 130 may be formed by removing a portion of the preliminary lower metal layer 130P (see FIG. 15) not covered by the preliminary solder layer 160P and the conductive pillar structure 150A.

In this case, side walls of the upper pillar layer 156A and the lower pillar layer 152A may be exposed to an etchant used in a wet etching process for forming the lower metal layer 130, and thus may be removed by a predetermined width. Side walls of the diffusion barrier layer 154 and the preliminary solder layer 160P may be hardly removed by the etchant or may be removed by a much smaller width than that of the upper pillar layer 156A and the lower pillar layer 152A. Accordingly, the protrusion 150O may be formed on a side wall of the conductive pillar structure 150A.

Figure 17:
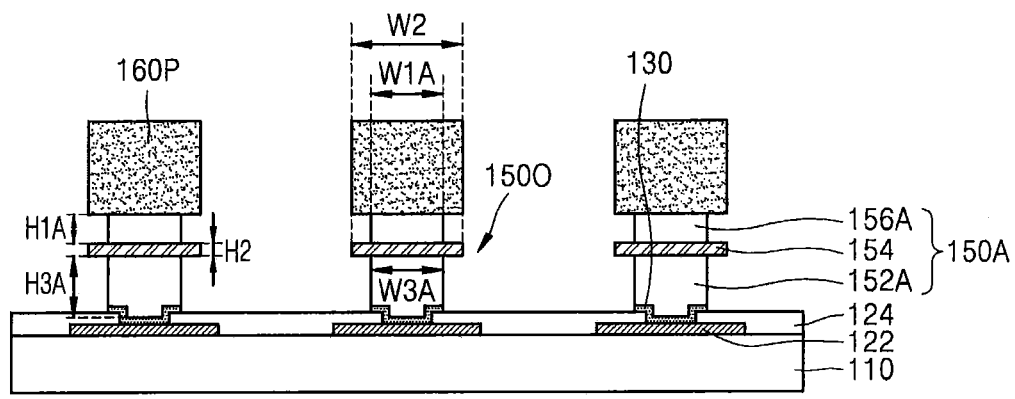

Referring to FIG. 17, the side walls of the lower pillar layer 152A and the upper pillar layer 156A may each be removed by a predetermined width.

In example embodiments, a process of removing the side walls of the lower pillar layer 152A and the upper pillar layer 156A may be a wet etching process. The diffusion barrier layer 154 and the preliminary solder layer 160P may include a material having an etch selectivity with respect to the lower pillar layer 152A and the upper pillar layer 156A, and thus may be hardly removed in the wet etching process.

In example embodiments, the first width W1A of the upper pillar layer 156A may range from about 30% to about 80% of the second width W2 of the diffusion barrier layer 154. Also, the third width W3A of the lower pillar layer 152A may range from about 30% to about 80% of the second width W2 of the diffusion barrier layer 154.

Figure 18:
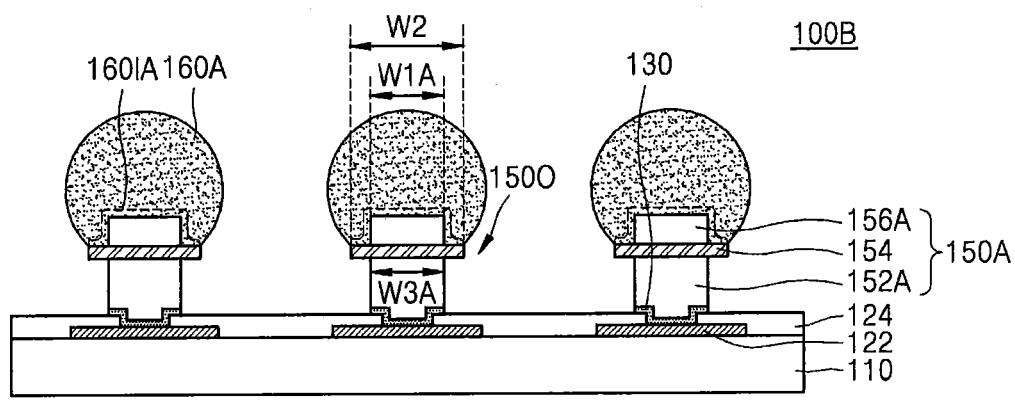

Referring to FIG. 18, the solder layer 160A having a spherical or ball shape may be formed by using a reflow process.

In example embodiments, the solder layer 160A may flow downward along the side wall of the upper pillar layer 156A and may contact the edge top surface 154U of the diffusion barrier layer 154 in the reflow process. Accordingly, the solder layer 160A may cover the entire side wall and the entire top surface of the upper pillar layer 156A, and may cover substantially an entire area of the edge top surface 154U of the diffusion barrier layer 154. However, the solder layer 160A may not be formed on the side wall 154S of the diffusion barrier layer 154.

The semiconductor chip 100B may be manufactured by performing the above processes.

Figure 19:
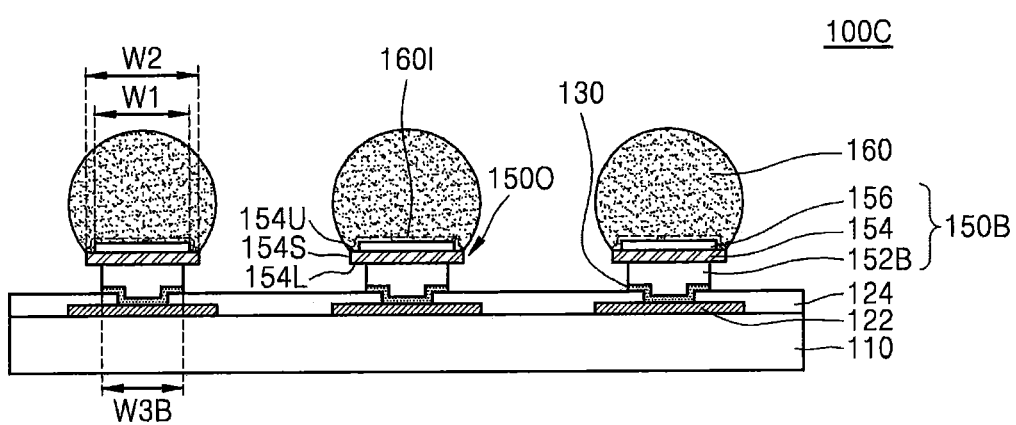
FIG. 19 is a cross-sectional view for explaining methods of manufacturing semiconductor chips according to example embodiments.

FIG. 19 is a cross-sectional view for explaining a method of manufacturing a semiconductor chip according to example embodiments. FIG. 19 may be a cross-sectional view for explaining a method of manufacturing the semiconductor chip 100C of FIG. 5. In FIG. 19, the same reference numerals as those in FIGS. 1 through 18 denote the same elements.

First, the solder layer 160 may be formed on the conductive pillar structure 150B by performing the above processes of FIGS. 7 through 13.

Referring to FIG. 19, a side wall of the lower pillar layer 152B may be removed by a predetermined width.

In example embodiments, the diffusion barrier layer 154 may include a material having an etch selectivity with respect to the lower pillar layer 152B, and a side wall of the diffusion barrier layer 154 may be hardly removed in an etching process for removing the side wall of the lower pillar layer 152B. Also, since an entire side wall and an entire top surface of the upper pillar layer 156 are covered by the solder layer 160, the upper pillar layer 156 may not be damaged in the etching process. Accordingly, the width W3B of the lower pillar layer 152B may be less than the first width W1 of the upper pillar layer 156.

The semiconductor chip 100C may be manufactured by performing the above processes.

Figure 20:
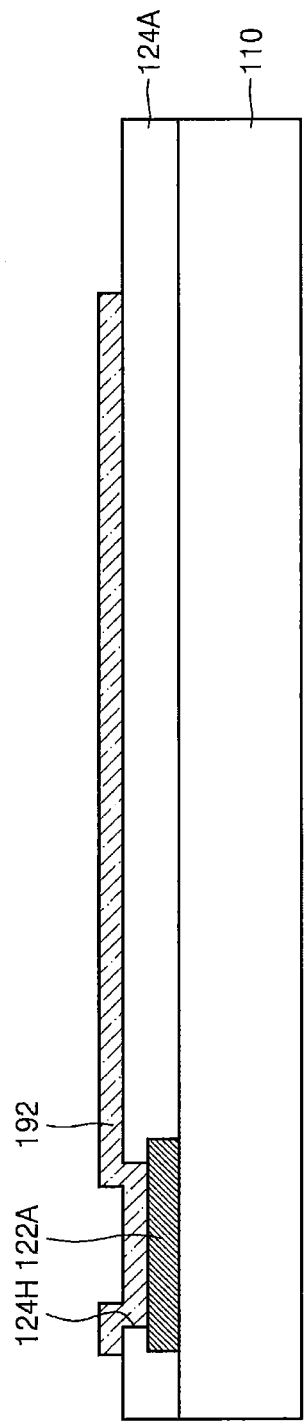
FIGS. 20 through 23 are cross-sectional views for explaining methods of manufacturing semiconductor chips according to example embodiments.

FIGS. 20 through 23 are cross-sectional views for explaining a method of manufacturing a semiconductor chip according to example embodiments. FIGS. 20 through 23 may be cross-sectional views for explaining a method of manufacturing the semiconductor chip 100D of FIG. 6. In FIGS. 20 through 23, the same reference numerals as those in FIGS. 1 through 19 denote the same elements. Referring to FIG. 20, the conductive pad 122A may be formed on the semiconductor substrate 110, and the passivation layer 124A may be formed on the conductive pad 122A. The passivation layer 124A may have the opening 124H, and the opening 124H may expose a part of a top surface of the conductive pad 122A.

A conductive layer (not shown) may be formed on the conductive pad 122A and the passivation layer 124A, and then the redistribution layer 192 electrically connected to the conductive pad 122A may be formed by patterning the conductive layer. The redistribution layer 192 may cover a side wall and the bottom of the opening 124H and may extend to be disposed over the passivation layer 124A.

Figure 21:
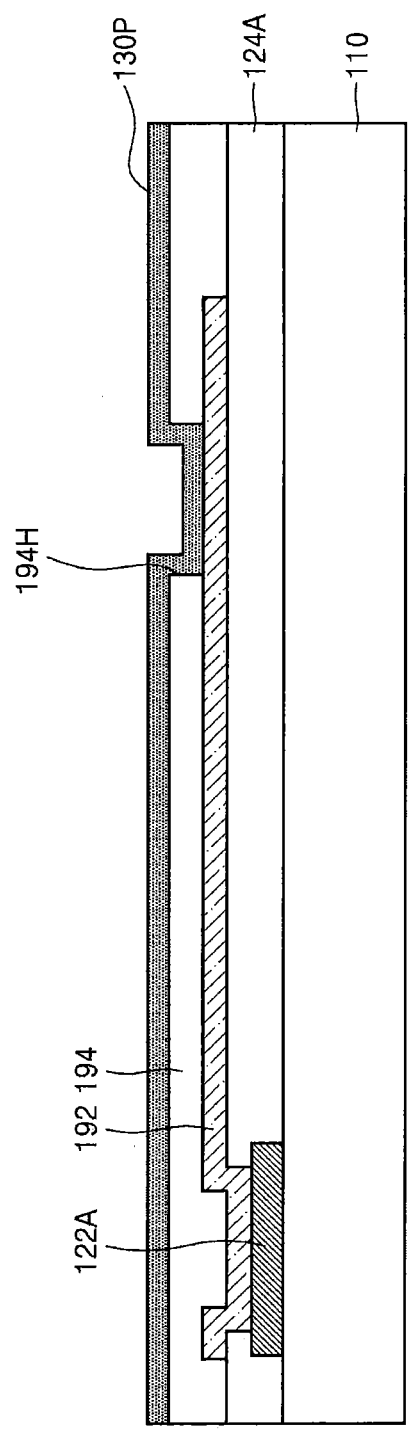

Referring to FIG. 21, an insulating layer (not shown) that covers the passivation layer 124A and the redistribution layer 192 may be formed, and the redistribution insulating layer 194 having the opening 194H through which a part of a top surface of the redistribution layer 192 is exposed may be formed by performing a patterning process on the insulating layer. In example embodiments, the redistribution insulating layer 194 may be formed by using photosensitive polyimide, silicon nitride, silicon oxide, or silicon oxynitride.

Next, the preliminary lower metal layer 130P may be formed on the redistribution insulating layer 194. The preliminary lower metal layer 130P may cover a side wall and the bottom of the opening 194H of the redistribution insulating layer 194 and may be electrically connected to the redistribution layer 192.

Figure 22:
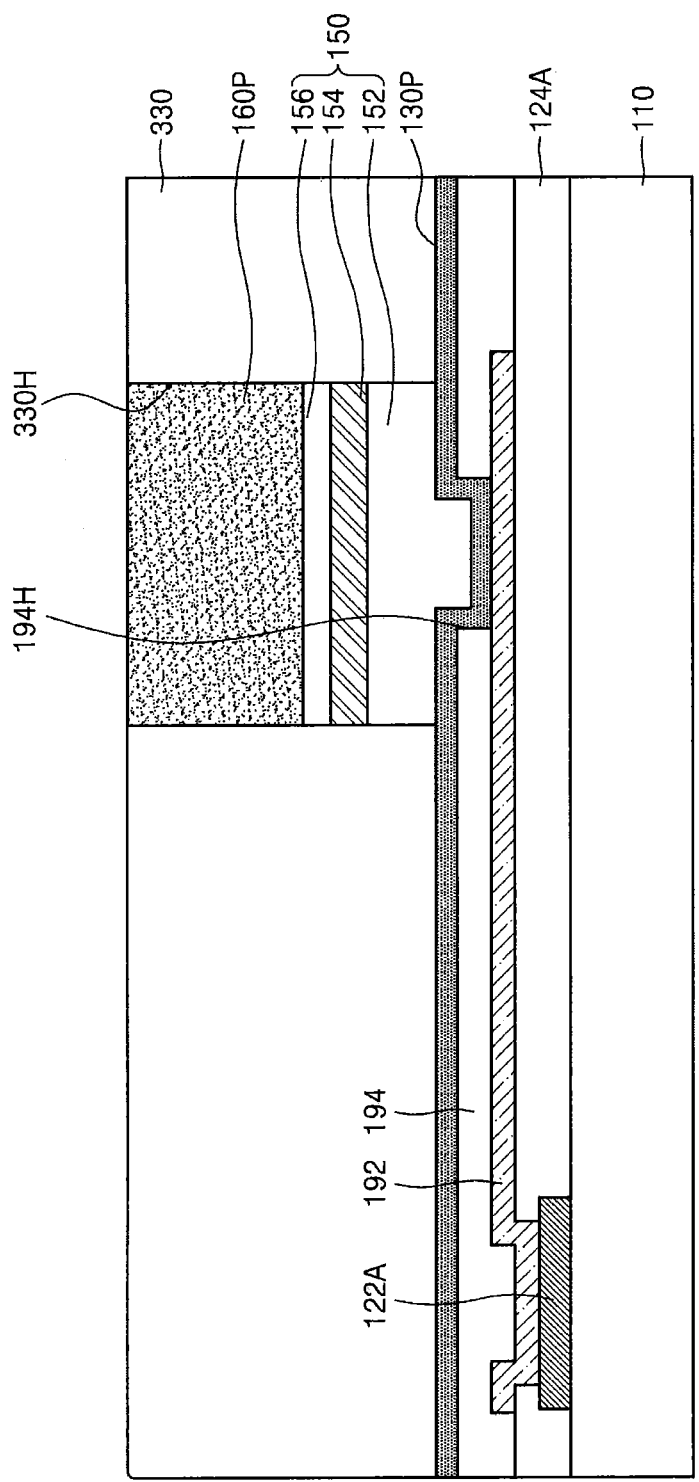

Referring to FIG. 22, a mask layer 330 having an opening 330H may be formed on the redistribution layer 192. The opening 330H may be formed to vertically overlap the opening 194H of the redistribution insulating layer 194. Accordingly, a portion of the preliminary lower metal layer 130P contacting the redistribution layer 192 may be exposed through the opening 330H of the mask layer 330.

Next, the lower pillar layer 152, the diffusion barrier layer 154, the upper pillar layer 156, and the preliminary solder layer 160P may be sequentially formed in the opening 330H.

Figure 23:
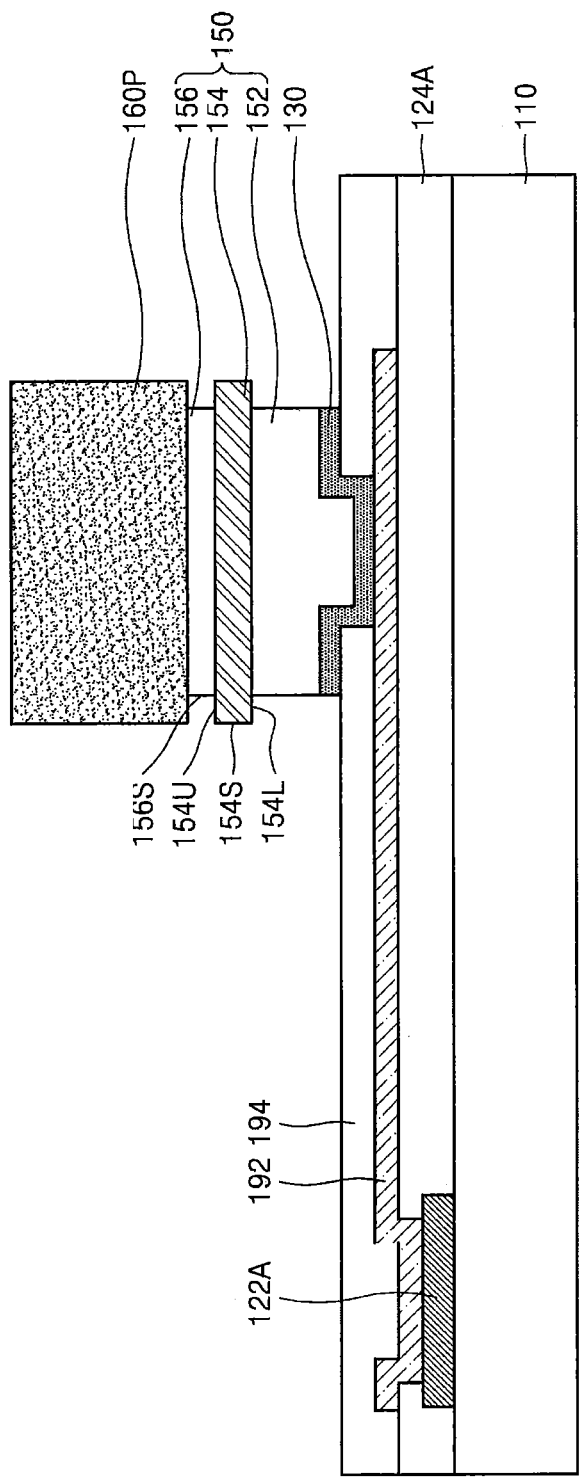

Referring to FIG. 23, the mask layer 330 (see FIG. 22) may be removed, and the lower metal layer 130 may be formed by removing a portion of the preliminary lower metal layer 130P not covered by the preliminary solder layer 160P and the conductive pillar structure 150. In this case, side walls of the lower and upper pillar layers 152 and 156 exposed to an etchant in a process of removing the portion of the preliminary lower metal layer 130P may each be removed by a predetermined width. As shown in FIG. 23, the side wall 156S of the upper pillar layer 156 may be disposed more inward than the side wall 154S of the diffusion barrier layer 154, and the edge top surface 154U of the diffusion barrier layer 154 may be exposed.

Referring back to FIG. 6, the solder layer 160 having a spherical or ball shape may be formed by performing a reflow process.

The semiconductor chip 100D may be manufactured by performing the above processes.

Figure 24:
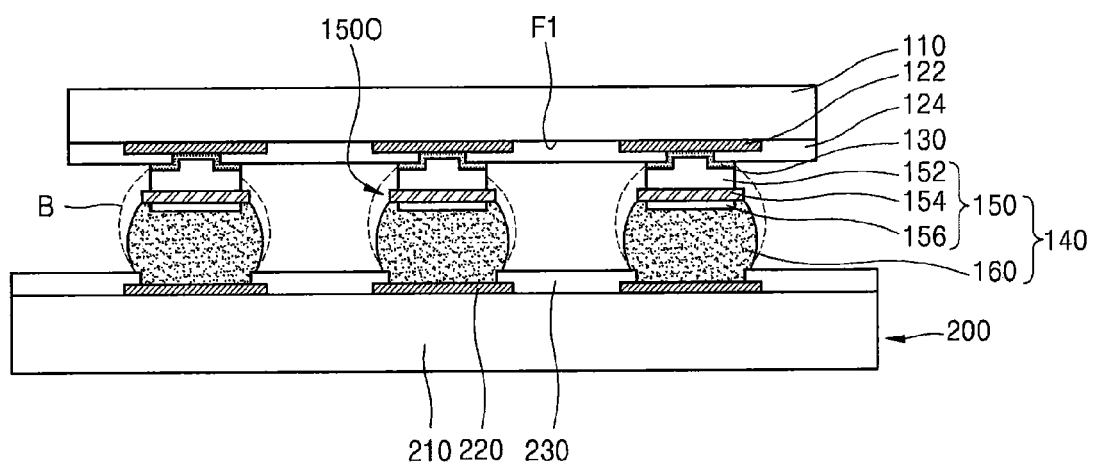
FIG. 24 is a cross-sectional view for explaining methods of manufacturing semiconductor devices according to example embodiments.

FIG. 24 is a cross-sectional view for explaining a method of manufacturing the semiconductor device 1 according to example embodiments. In FIG. 24, the same reference numerals as those in FIGS. 1 through 23 denote the same elements.

First, the semiconductor chip 100 may be formed by performing the above processes of FIGS. 7 through 13. The semiconductor chip 100 may include the conductive pillar structure 150 including the protrusion 150O on a side wall of the conductive pillar structure 150 and the solder layer 160 disposed on the conductive pillar structure 150.

Although not shown in FIG. 24, a flux (not shown) may be formed on parts of the solder layer 160 and the conductive pillar structure 150. The flux may be formed to a small thickness on a surface of the solder layer 160 in order to prevent an undesired reaction such as oxidation of the solder layer 160. In example embodiments, the flux may include a chloride, a fluoride, or a resin and may be formed by using coating.

Next, the package substrate 200 including the connection pad 220 and the insulating layer 230 that exposes a part of the connection pad 220 may be provided on one surface of the base substrate 210.

The semiconductor chip 100 may be mounted on the package substrate 200 by using flip-chip bonding. A first surface F1 of the semiconductor chip 100 may face the package substrate 200 so that the solder layer 160 contacts the connection pad 220. In example embodiments, a process for attaching the solder layer 160 to the connection pad 220 may be performed at a temperature high enough for a part of the solder layer 160 to melt. As shown in FIG. 24, the protrusion 150O may be formed on the side wall of the conductive pillar structure 150, and thus the solder layer 160 may not flow downward along the side wall of the conductive pillar structure 150 and the solder layer 160 may not contact a side wall of the lower pillar layer 152.

For comparison to the inventive concept, a profile B of a solder layer in a semiconductor chip including a conductive pillar structure not including a protrusion on a side wall is shown by a dashed line in FIG. 24. When the solder layer is disposed on the conductive pillar structure not including the protrusion on the side wall, the solder layer may flow downward along the side wall of the conductive pillar structure in a reflow process of the solder layer and/or a process for attaching the solder layer to a connection pad. Accordingly, the solder layer may cover a part of a side wall of the lower pillar layer and an IMC may be formed by a reaction between metal materials included in the solder layer and the lower pillar layer. When the IMC is formed, a volume of the solder layer that may contribute to reliable electrical connection between the semiconductor chip and the connection pad may be reduced. Also, a void may be formed in the solder layer, and when the semiconductor chip is used for a long time, the reliability of the semiconductor chip may be reduced due to the void.

However, as shown in FIG. 24, when the protrusion 150O is formed on the side wall of the conductive pillar structure 150, the solder layer 160 may be prevented from flowing downward along the side wall of the conductive pillar structure 150, and thus the connection terminal 140 may provide reliable electrical connection.

Referring back to FIG. 1, the underfill layer 170 that surrounds a side wall of the connection terminal 140 may be formed between the semiconductor chip 100 and the package substrate 200. Next, the molding material 180 that surrounds a top surface and a side wall of the semiconductor chip 100 may be formed. The molding material 180 may be formed by using an epoxy mold compound (EMC) or the like. Next, the external terminal connection pad 240 and the external terminal 250 attached to the external terminal connection pad 240 may be formed on the other surface of the package substrate 200. However, a process of forming the external terminal connection pad 240 and/or the external terminal 250 may be performed before a process of attaching the semiconductor chip 100 of FIG. 24.

Accordingly, as described hereinabove, an electronic device (e.g., semiconductor device) is provided, which includes a substrate 110 having an electrically conductive contact pad 122 thereon and an electrically conductive connection terminal 140 on the contact pad 122. The connection terminal 140 includes an electrically conductive pillar structure 150 and a solder layer 160 that extends on the pillar structure 150 and contacts a protruding portion of a sidewall of the pillar structure 150. In some of these embodiments of the invention, the pillar structure 150 includes a lower pillar layer 152, a diffusion barrier layer 154 on the lower pillar layer 152 and an upper pillar layer 156 on the diffusion barrier layer 154. The protruding portion of the sidewall of the pillar structure 150 includes an outermost portion of an upper surface (154U) of the diffusion barrier layer 154. This can be achieved by making a width of the diffusion barrier layer 154 greater than a width of the upper pillar layer 156 when viewed in transverse cross-section, so that the solder layer 160 directly contacts the outermost portion of the upper surface (154U) of the diffusion barrier layer 154 after a solder reflow process is performed.

As previously described and illustrated, an upper surface (154U) of the diffusion barrier layer 154 is configured to directly contact a bottom surface of the upper pillar layer 156. A width of the diffusion barrier layer 154 may also be greater than a width of the lower pillar layer 152 when viewed in transverse cross-section. Based on this configuration, the outermost portion of the upper surface (154U) of the diffusion barrier layer 154 will be ring/annular-shaped (e.g., circular-ring, rectangular-ring, etc.) when viewed in a direction normal to the upper surface of the diffusion barrier layer 154. Furthermore, the solder layer 160 may directly contact an upper surface of the upper pillar layer 156 and an entirety of a ring-shaped portion of an upper surface (154U) of the diffusion barrier layer 154. The upper pillar layer 156 and the diffusion barrier layer 154 may be configured as different materials having different reflow characteristics with respect to solder.

As previously described, a height of the solder layer 160 as measured from an upper surface of the upper pillar layer 156 is within a range from about 50% to about 90% the width of the diffusion barrier layer 154. A width of the upper pillar layer 156 may also be within a range from about 80% to about 98% the width of the diffusion barrier layer 154. Similarly, a width of the diffusion barrier layer 154 may be greater than a width of the lower pillar layer 152 when viewed in transverse cross-section and the width of the lower pillar layer 152 may be within a range from about 80% to about 98% the width of the diffusion barrier layer 154.

As further shown above (e.g., FIG. 2), a passivation layer 124 is provided on the substrate 110. The passivation layer 124 may have an opening therein, which exposes an upper surface of the contact pad 122. This opening may be lined with a lower metal layer 130 and a sidewall of the lower pillar layer may be aligned (or recessed) relative to a sidewall of the lower metal layer 130 (130A), as shown by FIGS. 2-3.

In addition, as shown by FIGS. 11-13, for example, a method of forming an electronic device includes forming a composite of a lower pillar layer 152, a diffusion barrier layer 154 on the lower pillar layer 152 and an upper pillar layer 156 on the diffusion barrier layer 154. A solder layer 160P is also formed on the upper pillar layer 156 prior to recessing a sidewall of the upper pillar layer 156 relative to sidewalls of the solder layer 160P and diffusion barrier layer 154, as shown by FIG. 12. Then, as illustrated by FIG. 13, this recessing step is followed by reflowing the solder layer 160 onto the recessed sidewall of the upper pillar layer 156 and onto an annular-shaped upper surface of the diffusion barrier layer 154.

While the inventive concept has been particularly shown and described with reference to example embodiments thereof, it will be understood that various changes in form and details may be made therein without departing from the spirit and scope of the following claims.

What is claimed is:

1. An electronic device, comprising:
   a substrate having an electrically conductive contact pad thereon; and
   an electrically conductive connection terminal on the contact pad, said connection terminal comprising an electrically conductive pillar structure and a solder layer that extends on the pillar structure and contacts a protruding portion of a sidewall of the pillar structure, said pillar structure comprising a lower pillar layer, a diffusion barrier layer on the lower pillar layer and an upper pillar layer on the diffusion barrier layer, said diffusion barrier layer having a width greater than a width of the upper pillar layer when viewed in transverse cross-section.

2. The device of claim 1, wherein the protruding portion of the sidewall of the pillar structure includes an outermost portion of an upper surface of the diffusion barrier layer.

3. The device of claim 1, wherein an upper surface of the diffusion barrier layer directly contacts a bottom surface of the upper pillar layer.

4. The device of claim 1, wherein the width of the diffusion barrier layer is greater than a width of the lower pillar layer when viewed in transverse cross-section.

5. An electronic device, comprising:
   a substrate having an electrically conductive contact pad thereon; and an electrically conductive connection terminal on the contact pad, said connection terminal comprising an electrically conductive pillar structure and a solder layer that extends on the pillar structure and contacts a protruding portion of a sidewall of the pillar structure, said pillar structure comprising a lower pillar layer, a diffusion barrier layer on the lower pillar layer and an upper pillar layer on the diffusion barrier layer, said protruding portion of the sidewall of the pillar structure including an outermost portion of an upper surface of the diffusion barrier layer and said solder layer directly contacting the outermost portion of the upper surface of the diffusion barrier layer.

6. The device of claim 5, wherein the outermost portion of the upper surface of the diffusion barrier layer is ring-shaped when viewed in a direction normal to the upper surface of the diffusion barrier layer.

7. An electronic device, comprising:
a substrate having an electrically conductive contact pad thereon; and
an electrically conductive connection terminal on the contact pad, said connection terminal comprising an electrically conductive pillar structure and a solder layer that extends on the pillar structure and contacts a protruding portion of a sidewall of the pillar structure, said pillar structure comprising a lower pillar layer, a diffusion barrier layer on the lower pillar layer and an upper pillar layer on the diffusion barrier layer and said solder layer directly contacting an upper surface of the upper pillar layer and an entirety of a ring-shaped portion of an upper surface of the diffusion barrier layer.

8. The device of claim 7, wherein the upper pillar layer and the diffusion barrier layer comprise different materials.

9. The device of claim 1, wherein a height of the solder layer as measured from an upper surface of the upper pillar layer is within a range from about 50% to about 90% the width of the diffusion barrier layer.

10. The device of claim 1, wherein the width of the upper pillar layer is within a range from about 80% to about 98% the width of the diffusion barrier layer.

11. The device of claim 1, wherein a width of the diffusion barrier layer is greater than a width of the lower pillar layer when viewed in transverse cross-section; and wherein the width of the lower pillar layer is within a range from about 80% to about 98% the width of the diffusion barrier layer.

12. The device of claim 1, wherein the width of the upper pillar layer is within a range from about 30% to about 80% the width of the diffusion barrier layer.

13. The device of claim 1, wherein a width of the lower pillar layer is less than a width of the upper pillar layer when viewed in transverse cross-section.

14. The device of claim 1, further comprising:
a passivation layer on said substrate, said passivation layer having an opening therein that exposes an upper surface of the contact pad;
wherein the opening is at least partially lined with a lower metal layer; and
wherein a sidewall of the lower pillar layer is aligned to a sidewall of the lower metal layer or the sidewall of the lower metal layer is recessed relative to the sidewall of the lower pillar layer.

* * * * *